(12) United States Patent
Druz et al.

(10) Patent No.: US 9,206,500 B2
(45) Date of Patent: Dec. 8, 2015

(54) METHOD AND APPARATUS FOR SURFACE PROCESSING OF A SUBSTRATE USING AN ENERGETIC PARTICLE BEAM

(76) Inventors: Boris Druz, Brooklyn, NY (US); Roger P. Fremgen, Jr., East Northport, NY (US); Alan V. Hayes, Great Neck, NY (US); Viktor Kanarov, Bellmore, NY (US); Robert Krause, Levittown, NY (US); Ira Reiss, New City, NY (US); Piero Sferlazzo, Marblehead, MA (US)

( * ) Notice: Subject to any disclaimer, the term of this patent is extended or adjusted under 35 U.S.C. 154(b) by 1508 days.

(21) Appl. No.: 12/212,844

(22) Filed: Sep. 18, 2008

(65) Prior Publication Data

US 2009/0098306 A1    Apr. 16, 2009

Related U.S. Application Data

(63) Continuation-in-part of application No. 10/915,745, filed on Aug. 11, 2004, now Pat. No. 7,879,201.

(60) Provisional application No. 60/973,312, filed on Sep. 18, 2007, provisional application No. 60/494,281, filed on Aug. 11, 2003.

(51) Int. Cl.
*C23C 14/04* (2006.01)
*C23C 14/22* (2006.01)
(Continued)

(52) U.S. Cl.
CPC ............ *C23C 14/044* (2013.01); *C23C 14/221* (2013.01); *H01J 37/20* (2013.01); *H01J 37/302* (2013.01); *H01J 37/317* (2013.01); *H01J 2237/0245* (2013.01); *H01J 2237/045* (2013.01);
(Continued)

(58) Field of Classification Search
CPC ..... C23C 14/044; C23C 14/221; H01J 37/20; H01J 37/302; H01J 37/317; H01J 2237/0245; H01J 2237/045; H01J 2327/20207; H01J 2237/20214; H01J 2237/20221; H01J 2237/30472; H01J 2237/3146
USPC ............... 118/729, 730; 204/192.11, 298.04, 204/298.05
See application file for complete search history.

(56) References Cited

U.S. PATENT DOCUMENTS 3,778,626 A    12/1973  Robertson
4,664,935 A  *  5/1987  Strahl ........................ 204/192.1
(Continued)

FOREIGN PATENT DOCUMENTS

DE    102004018079 A1    10/2005
JP    H07-197259 A    8/1995
(Continued)

OTHER PUBLICATIONS

Michael A. Band, Examiner, USPTO, Notice of Allowance issued in related U.S. Appl. No. 10/915,745 dated Nov. 3, 2010.
(Continued)

*Primary Examiner* — Michael Band
(74) *Attorney, Agent, or Firm* — Wood, Herron & Evans, LLP

(57) ABSTRACT

Method and apparatus for processing a substrate with an energetic particle beam. Features on the substrate are oriented relative to the energetic particle beam and the substrate is scanned through the energetic particle beam. The substrate is periodically indexed about its azimuthal axis of symmetry, while shielded from exposure to the energetic particle beam, to reorient the features relative to the major dimension of the beam.

20 Claims, 14 Drawing Sheets

(51) Int. Cl.
*H01J 37/20* (2006.01)
*H01J 37/302* (2006.01)
*H01J 37/317* (2006.01)

(52) U.S. Cl.
CPC ............. *H01J 2237/20207* (2013.01); *H01J 2237/20214* (2013.01); *H01J 2237/20221* (2013.01); *H01J 2237/30472* (2013.01); *H01J 2237/3146* (2013.01)

(56) References Cited

U.S. PATENT DOCUMENTS

| | | | |
|---|---|---|---|
| 4,793,908 A * | 12/1988 | Scott et al. | 204/192.26 |
| 4,814,056 A | 3/1989 | Welty | |
| 4,855,026 A * | 8/1989 | Sioshansi | 204/192.11 |
| 4,992,298 A | 2/1991 | Deutchman et al. | |
| 5,067,781 A | 11/1991 | Montanari et al. | |
| 5,240,583 A * | 8/1993 | Ahonen | 204/298.04 |
| 5,334,302 A | 8/1994 | Kubo et al. | |
| 5,340,454 A | 8/1994 | Schaefer et al. | |
| 5,879,519 A | 3/1999 | Seeser et al. | |
| 5,973,447 A | 10/1999 | Mahoney et al. | |
| 6,045,671 A | 4/2000 | Wu et al. | |
| 6,056,826 A | 5/2000 | Rick et al. | |
| 6,238,582 B1 | 5/2001 | Williams et al. | |
| 6,402,906 B1 | 6/2002 | Pichulo et al. | |
| 6,419,803 B1 | 7/2002 | Baldwin et al. | |
| 6,495,010 B2 | 12/2002 | Sferlazzo | |
| 6,579,420 B2 | 6/2003 | Wan et al. | |
| 6,669,824 B2 * | 12/2003 | Sferlazzo et al. | 204/298.04 |
| 6,716,322 B1 | 4/2004 | Hedge et al. | |
| 7,879,201 B2 | 2/2011 | Druz et al. | |
| 2005/0005846 A1 | 1/2005 | Selvamanickam et al. | |
| 2005/0034979 A1 | 2/2005 | Druz et al. | |
| 2009/0098306 A1 | 4/2009 | Druz et al. | |

FOREIGN PATENT DOCUMENTS

| JP | 2001247963 A | 9/2001 |
|---|---|---|
| WO | 2009039261 A1 | 3/2009 |

OTHER PUBLICATIONS

Michael A. Band, Examiner, USPTO, Office Action issued in related U.S. Appl. No. 10/915,745 dated Mar. 10, 2010.
European Patent Office, International Search Report issued in corresponding PCT Application serial No. PCT/US2008/076835 dated Nov. 28, 2008.
Office Action issued in a related U.S. Appl. No. 10/915,745; dated as mailed on Oct. 14, 2008; 12 pages, U.S. Patent and Trademark Office.
VEECO, "6 x 66cm RF Linear ion Source", Product Brochure, copyright 2002, 2 pages.
Office Action issued in a related U.S. Appl. No. 10/915,745; dated as mailed on May 13, 2008; 15 pages, U.S. Patent and Trademark Office.
Office Action issued in a related U.S. Appl. No. 10/915,745; dated as mailed on Oct. 9, 2007; 11 pages, U.S. Patent and Trademark Office.
European Patent Office, Examination Report received in corresponding European Application No. 1005502.8, dated Jan. 16, 2012, 1 pg.
European Patent Office, International Report on Patentability received in corresponding International Application No. PCT/US2008/076835, dated Mar. 24, 2010, 7 pg.
United States Patent and Trademark Office, Office Action in corresponding U.S. Appl. No. 10/915,745, dated Aug. 23, 2010, 11 pg.
United States Patent and Trademark Office, Office Action in corresponding U.S. Appl. No. 10/915,745, dated Apr. 28, 2009, 18 pg.
"Ion source" retrieved from the Internet <http://en.wikipedia.org/wiki/ion_source> on Mar. 16, 2009.
"Ion source" retrieved from the internet <http://www.encarta.co.uk/dictionary_1861818273 1ion_source.htnnl> on Mar. 16, 2009.
"Ion source" retrieved from the Internet <http://www.answers.com/topic/ion-source> on Mar. 16, 2009.
PCT/US2014/027925, International Search Report and Written Opinion mailed Jun. 20, 2014.

\* cited by examiner

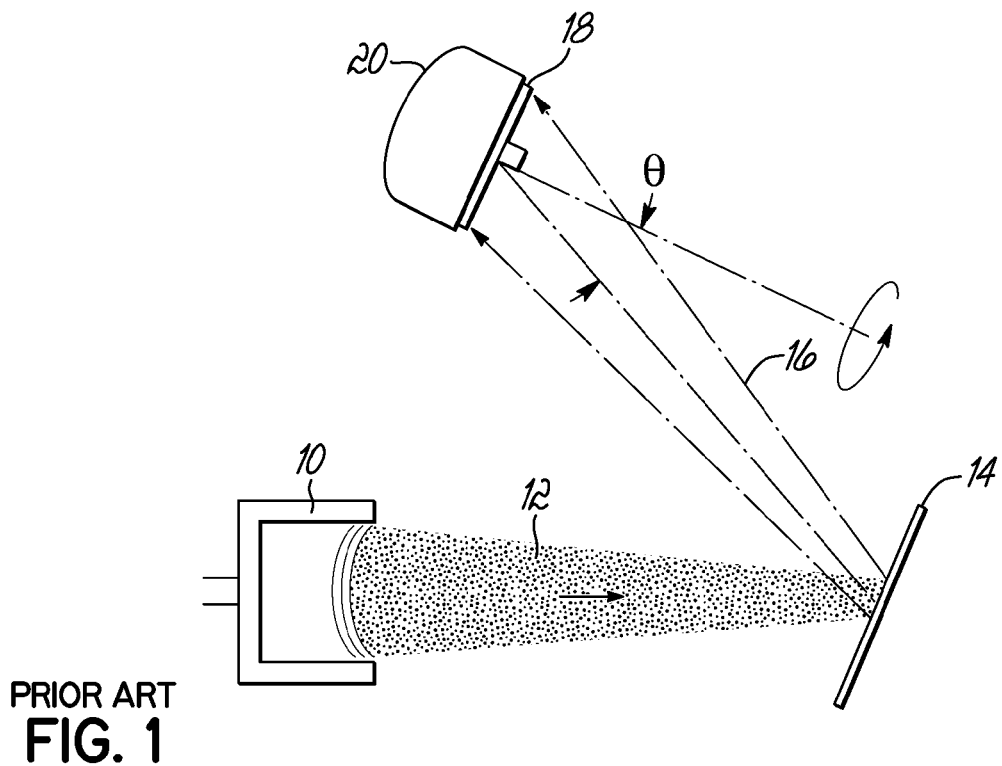
PRIOR ART
FIG. 1
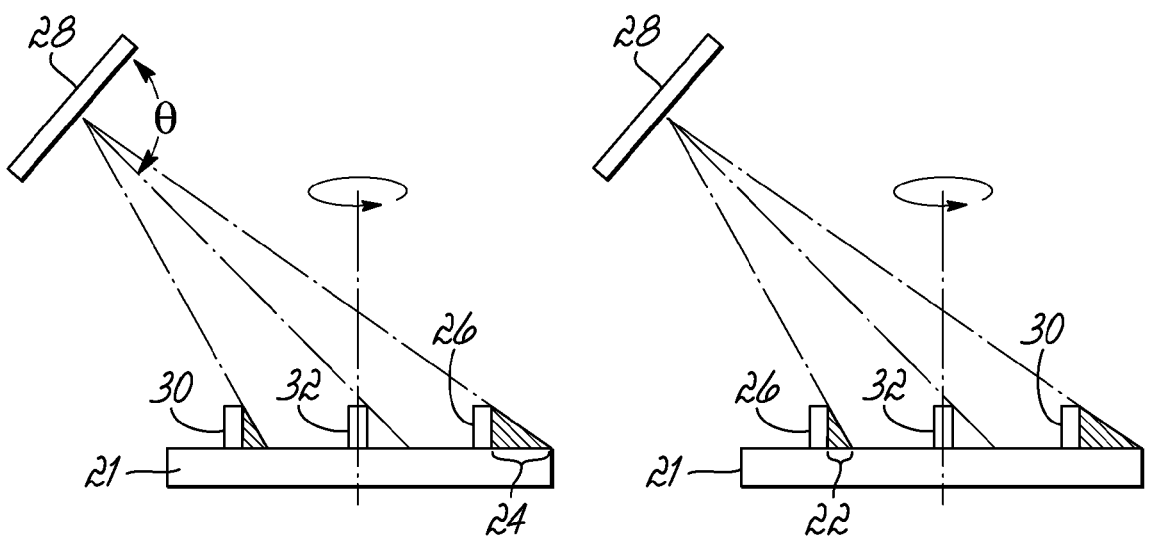
PRIOR ART
FIG. 2A
PRIOR ART
FIG. 2B

METHOD AND APPARATUS FOR SURFACE PROCESSING OF A SUBSTRATE USING AN ENERGETIC PARTICLE BEAM

CROSS-REFERENCE TO RELATED APPLICATIONS

The present application claims the benefit of Provisional Application No. 60/973,312, filed Sep. 18, 2007. The present application is a continuation-in-part of application Ser. No. 10/915,745, filed Aug. 11, 2004, which claims the benefit of Provisional Application No. 60/494,281, filed Aug. 11, 2003. The disclosure of each of these documents is hereby incorporated by reference herein in its entirety.

BACKGROUND

This invention relates generally to materials processing and, more particularly, to apparatus and methods for processing or treating the surface of a substrate with an energetic particle beam.

Sputter deposition and ion beam deposition (IBD) are familiar methods for depositing thin film materials. These deposition processes require deposition on substrates with particular topographical features that affect the distribution and properties of deposited material across the substrate. For example, lift-off deposition processes in which thin films are deposited over a pattern of photoresist features are used in many important thin film device fabrication processes.

IBD is particularly well suited for lift-off deposition processes due to some unique advantages of the process, including low process pressures and directional deposition. As a result, the lift-off step is extremely clean and repeatable down to critical dimensions less than 0.5 microns. Primarily because of these advantages, IBD has become the dominant method for depositing stabilization layers for thin film magnetic heads as a lift-off step is required subsequent to the deposition of the stabilizing material. In addition to good lift-off properties, IBD films have extremely good magnetic properties. The substrate may be tilted to different angles to optimize the properties of the IBD deposited film and rotated to average out non-uniformities introduced by the tilting.

With reference to FIG. 1, an IBD system generally includes a deposition gun 10 that directs an energized beam 12 of ions to a target 14 of material to be deposited. The ion beam 12 sputters material from a finite, well-confined source region on the target 14 to generate a beam 16 of sputtered target material. A substrate 18 is held on a fixture 20 and positioned so that the beam 16 impinges the substrate 18. The target 14 is approximately the size of substrate 18, which is located the equivalent of a few substrate diameters away from the target 14. The fixture 20 is configured to tilt the normal to the surface of substrate 18 at an angle $\theta$ relative to the direction of the deposition flux 16 and to continuously rotate the substrate 18 about the surface normal.

The divergence angle of the beam 16 depends on the geometrical relationship between the target 14 and substrate 18. One contribution to the divergence angle arises because the ion beam 12 is focused on the target 14 to prevent ion beam sputtering of nearby components in the process chamber. Another contribution to the divergence angle originates from the target-to-substrate distances that are limited due to the deposition rate reduction.

Beam divergence in IBD systems cause asymmetrical shadowing of the substrate surface by the features projecting from the substrate surface, such as the features characterizing a photoresist pattern. This causes the deposited material to have an asymmetric deposition profile relative to the features, which reduces the area over which lift-off is acceptable and reduces magnetic property uniformity.

The substrate may be oriented relative to the flux direction so that its surface normal is aligned with the line of sight between substrate and the deposition flux source region on the sputter target, which is typically the center of the target, and rotated about its centerline. Under these circumstances, the substrate is not shadowed by the feature on the inboard or radially-innermost side of the feature. In contrast, the substrate will always be shadowed by the feature on the outboard or radially-outermost side of the feature. The degree of shadowing on the outboard side increases with increasing radial separation between the feature and the substrate centerline and also with increasing divergence of the deposition flux. The resulting deposition profile is highly asymmetrical.

Tilting the surface normal with respect to the line of sight between the target and the substrate during deposition improves the symmetry of the deposition profile by reducing the substrate shadowing on the outboard side of features. However, the nature of the substrate shadowing on the outboard and inboard sides of the feature depends on the azimuthal position of the feature as the substrate is rotated, as described below.

FIGS. 2A and 2B illustrate the shadow cast on a substrate 21 by the inboard side and the outboard side of a feature 26 projecting from substrate 21 at a location between the substrate center and peripheral edge. FIG. 2A shows the feature 26 with the substrate 21 oriented at a first azimuthal angle and tilted relative to a target 28 of an IBD system. The outboard side of the feature 26 shadows the substrate 21 over a distance 24. The inboard side of the feature 26 does not shadow the substrate 21. FIG. 2B shows feature 26 with the substrate 21 oriented at a second azimuthal angle that locates feature 26 at an angular position diametrically opposite to the position at the first azimuthal angle. The inboard side of the feature 26 shadows the substrate 21 over a distance 22, which is a smaller distance than distance 24. The outboard side of the feature 26 does not shadow the substrate 21 at the second azimuthal angle.

Despite substrate tilting, the shadowing of the substrate 21 over distance 24 on the outboard side of the feature 26 differs from the shadowing of the substrate 21 over distance 22 by the inboard side. In particular, the profile of the deposited material will differ on the inboard and outboard sides of the feature 26 adjacent to the sidewalls of feature 26. Specifically, the longer shadow cast over distance 24 adjacent to the outboard side results in a relatively longer taper of the deposited material than adjacent to the inboard side.

The shadowed substrate region on the outboard side of the feature 26 also experiences a lower deposition rate because it is effectively further away from the target 28 when the substrate 21 is oriented at the first azimuthal angle. The inboard substrate region experiences a higher deposition rate because it is closer to the target 28 when the substrate 21 is oriented at the second azimuthal angle. Therefore, the deposited material is thinner on the outboard side of feature 26, due to the outboard region being further away from the target 28. The asymmetry and difference in deposition rate, which originate from the beam divergence of the target 28, increase with increasing radial distance from the center of substrate 21.

Feature 30, which is at the same radial distance from the substrate center as feature 26, experiences the same asymmetries and differences in deposition rate as feature 26. On the other hand, the deposited material is radially symmetrical about feature 32 at the substrate center because feature 32 symmetrically shadows the substrate 21 adjacent to its sidewalls. Other types of surface treatments, such as etching, will have similar asymmetrical treatment profiles about the features 26 and 30.

It would therefore be desirable to provide a deposition method capable of eliminating or, at the least, significantly reducing the inboard and outboard asymmetries of the deposited material adjacent to a feature projecting from the surface of a substrate.

SUMMARY

In accordance with an embodiment of the invention, a system for processing a substrate includes a vacuum chamber containing a source configured to emit an energetic particle beam. The source has a major dimension and the beam has a substantially uniform flux distribution across at least a portion of the major dimension. The vacuum chamber includes a treatment zone across which the beam impinges the substrate. The system further includes a fixture disposed inside the vacuum chamber at a position spaced from the source. The fixture includes a first stage configured to hold the substrate and a second stage adapted to translate the first stage relative to the source. The first stage is configured to index the substrate about an azimuthal axis to different angular orientations. The second stage is capable of translating the substrate through the treatment zone with each of the different angular orientations and to a parking area outside of the treatment zone in which the first stage is used to index the substrate.

In accordance with another embodiment of the invention, a method is provided for processing a substrate includes supplying an energetic particle beam having a substantially uniform flux distribution over at least a portion of a major dimension thereof. The method further includes aligning features on the substrate substantially parallel with the major dimension of the beam, moving the substrate relative to the beam, and exposing the substrate to the energetic particles in a treatment zone during at least a portion of the movement.

Processing may be performed on one side of the feature if the substrate is moved relative to the major dimension of the energetic particle beam without rotation. Alternatively, the substrate may be processed adjacent to both sides of the feature if the substrate is rotated 180° after each cycle of the substrate surface treatment, as described herein.

Various objects and advantages of the invention shall be made apparent from the accompanying drawings of the illustrative embodiment and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a diagrammatic view of a conventional IBD system in accordance with the prior art;

FIGS. 2A and 2B are diagrammatic views illustrating the asymmetrical deposition profile for features on a substrate of the conventional IBD system of FIG. 1;

DETAILED DESCRIPTION OF THE PREFERRED EMBODIMENTS

Figure 3:
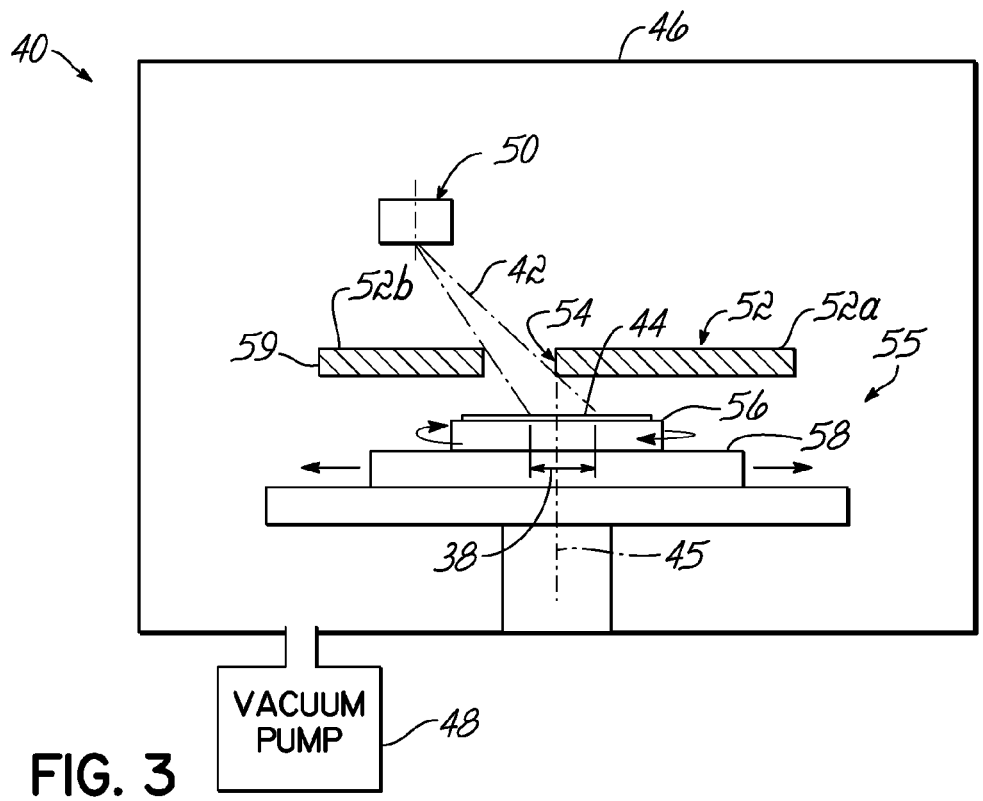
FIG. 3 is a diagrammatic side view of a substrate processing apparatus in accordance with the invention.
Figure 3A:
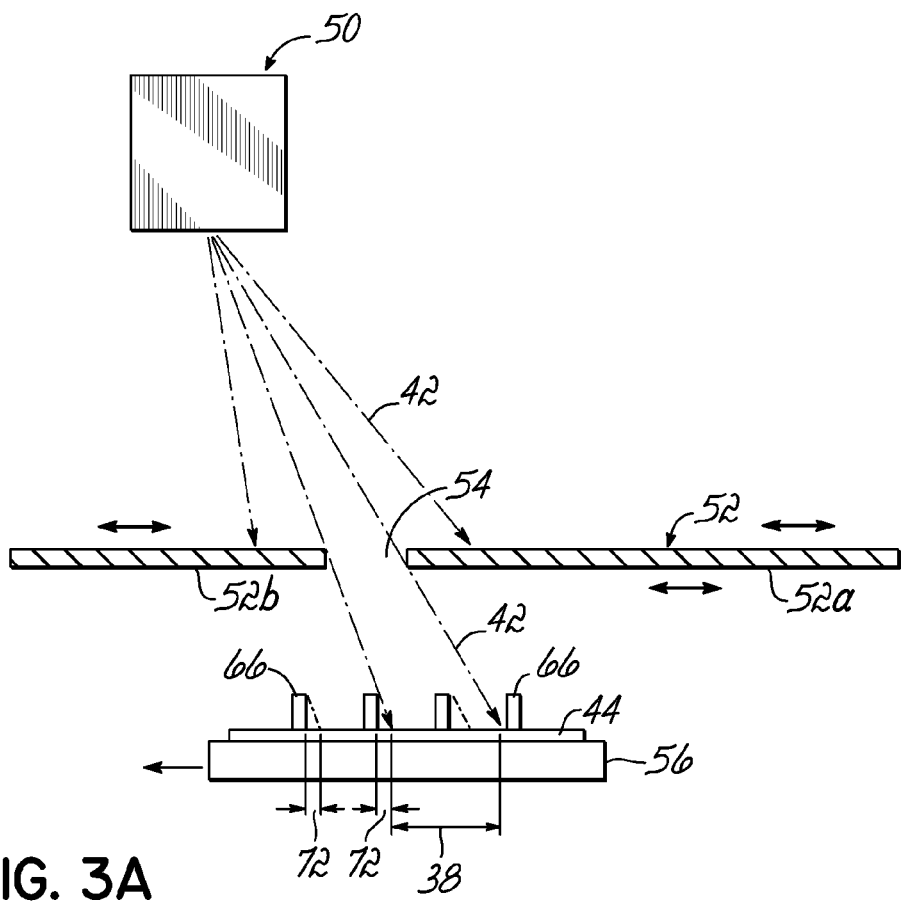
FIG. 3A is a detailed view of a portion of FIG. 3.
Figure 4A:
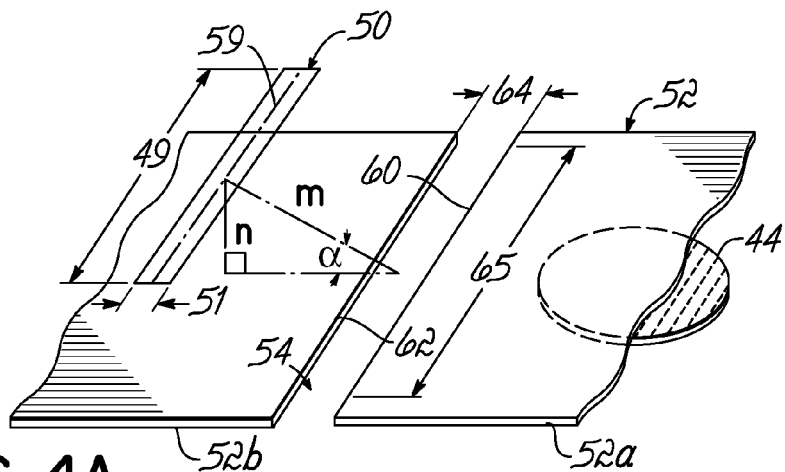
FIGS. 4A and 4B are diagrammatic perspective views of the substrate processing apparatus of FIG. 3 illustrating the geometrical relationships between the source, the aperture, and the substrate.

With reference to FIGS. 3 and 3A, a processing apparatus 40 includes a source 50, which is preferably rectangular but not so limited, adapted to emit a beam 42 of energetic particles. The energetic particles from source 50 may etch a substrate 44, deposit a thin film or layer of material on substrate 44, or otherwise treat substrate 44. The source 50 may have a geometrical shape similar to the geometrical shape of aperture 54, which reduces the unused portion of the beam 42 from the source 50 that does not treat the substrate 44. The source 50 is characterized by a major axis or dimension 49 (FIG. 4A) and a minor axis or dimension 51 (FIG. 4A). Beam 42 has a substantially uniform flux distribution along the major dimension 49 of the source 50.

The processing apparatus 40 includes a vacuum chamber 46 that is isolated from the surrounding environment. Vacuum chamber 46 may be evacuated to a suitable vacuum pressure by a vacuum pump 48 as recognized by a person of ordinary skill in the art. A sealable port (not shown) is provided in the vacuum chamber 46 for accessing the interior of vacuum chamber 46 to exchange processed substrates 44 for unprocessed substrates 44.

The source 50 of beam 42 is any ion beam source capable of generating energetic particles for performing a thin film deposition, an etching process, a reactive ion etching process, a sputtering process, or other ion beam treatment. For example, the source 50 may be a magnetron of with a sputtering target of any material that provides thin film deposition. Another example is a rectangular ion beam source 50 with flat or dished grid ion optics to emit energetic particles in direction to the aperture 54 that provides a substrate surface etch. In a preferred embodiment of the invention, the source 50 is an ion beam deposition (IBD) source including a target of deposition material sputtered by a beam of inert gas ions and a magnetron confining a plasma proximate to the target that provides the source of the gas ions. Such sources 50 and, in particular, rectangular sources 50, require no further description herein in order to be understood by persons of ordinary skill.

The substrate 44 and source 50 are positioned in different parallel planes. A shield 52 may be located in an intervening position between the substrate 44 and the source 50 so that the aperture 54 is located in a plane that is substantially parallel to the plane of the substrate 44. The optional shield 52 has a rectangular opening or aperture 54 characterized by a major axis or dimension 65 (FIG. 4A) substantially aligned with the major dimension 49 (FIG. 4A) of the source 50 along which beam 42 is uniform. The aperture 54 in shield 52 collimates beam 42 so that only a fraction of energetic particles emitted from source 50, preferably a majority of the energetic particles, are transmitted through the aperture 54 and strike the substrate 44 in a treatment area or zone 38 to thereby treat the substrate 44. Typically, the major dimension 65 (FIG. 4A) of aperture 54 is greater than the diameter of substrate 44 and the minor dimension 64 (FIG. 4A) of aperture 54 is less than or equal to the diameter of substrate 44. The location of the treatment zone 38 remains fixed as the substrate 44 is moved.

References herein to terms such as "vertical", "horizontal", etc. are made by way of example, and not by way of limitation, to establish a frame of reference. It is understood that various other frames of reference may be employed without departing from the spirit and scope of the invention. For example, a person of ordinary skill will recognize that the arrangement of the source 50 and the fixture 55 may be inverted so that the substrate 44 is above the source 50.

With continued reference to FIGS. 3 and 3A, the substrate 44 is held and supported by a two-stage fixture 55 having a rotational stage 56 adapted to rotate the substrate 44 in at least one rotational sense about an azimuthal axis 45 of the rotational stage 56. Rotation of the substrate 44 about the azimuthal axis 45 changes the orientation of features 66 (FIG. 5A) on the substrate 44 relative to the direction of the beam 42. A translation stage 58 of fixture 55, which supports the rotational stage 56, is adapted to move or translate the substrate 44 linearly and bi-directionally (i.e., reversibly) relative to the aperture 54. The translation stage 58 is movable over a range of motion adequate to position substrate 44 in flux-blocked positions on opposite sides of aperture 54 in which the shield 52 is interposed between the substrate 44 and source 50. The movements of stages 56 and 58 are mutually independent so that the substrate 44 may be translated by stage 58 without rotation and, conversely, the substrate 44 may be rotated by stage 56 without translation. The translation stage 58 translates the substrate 44 in a direction approximately orthogonal to the major dimension 65 (FIG. 4A) of aperture 54.

In an alternative embodiment of the invention, the translation stage 58 may be replaced by a planetary stage (not shown) that revolves the substrate 44 and rotational stage 56 about a relatively large radius of curvature in a plane parallel to the substrate plane. The radius of the curve traced by the substrate 44 when moved by the planetary stage is large enough to be approximately linear over the minor dimension 64 of aperture 54. Preferably, the center of the source 50 and aperture 54, and the arc traced by the center of fixture 55 are in a cylindrical plane with a radius of curvature exceeding the distance between the source 50 and aperture 54.

With reference to FIG. 4A, the position of aperture 54 with respect to the source 50 determines the incident angle at which energetic particles from the beam 42 (i.e., particle flux) impinge the substrate 44. The source 50 may be considered to be a line source having a centerline 59 extending across its major dimension 49. The average incident angle, $\alpha$, of the particle flux is defined as the inverse sine of the quotient of a dividend given by the perpendicular distance from the centerline 59 of source 50 to the plane of the optional shield 52, labeled with the alphanumeric character "n" in FIG. 4A, divided by a divisor given by the distance from the centerline 59 of the source 50 to the mid-line of the aperture 54 defined between edges 60, 62, labeled with the alphanumeric character "m" in FIG. 4A. As is apparent, the average incident angle increases (i.e., becomes more oblique) as the distance from centerline 59 to the center of aperture 54 increases.

Figure 4B:
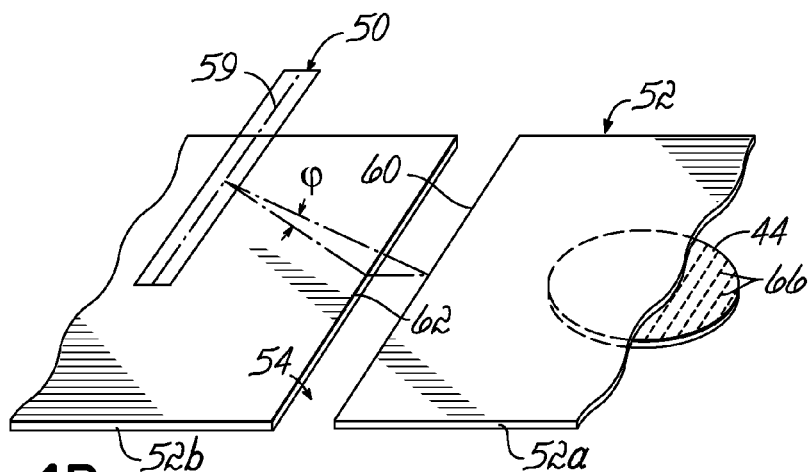

With reference to FIG. 4B, the minor dimension 64 (FIG. 4A) of the aperture 54 determines the collimation of beam 42. The collimation angle is determined from the angular arc subtended from the source 50 to the opposite edges 60, 62 of the aperture 54 and defines the angular distribution of the flux about the average incident angle. Edge 60 is most distant from source 50 and edge 62 is closest to source 50. The distance in the plane of the shield 52 between edges 60, 62 specifies the minor dimension 64 of the aperture 54. The aperture 54 also has a major dimension 65 orthogonal to the minor dimension 64. The collimation angle, $\phi$, is equal to the difference between the inverse cosine of the quotient of a dividend given by the distance, n, divided by a divisor given by the distance from the centerline 59 to edge 60 minus the inverse cosine of the quotient of a dividend given by the distance, n, divided by a divisor given by the distance from the centerline 59 to edge 62. As is apparent, the collimation angle for the deposition flux may be reduced by reducing the separation between edges 60, 62.

Figure 3B:
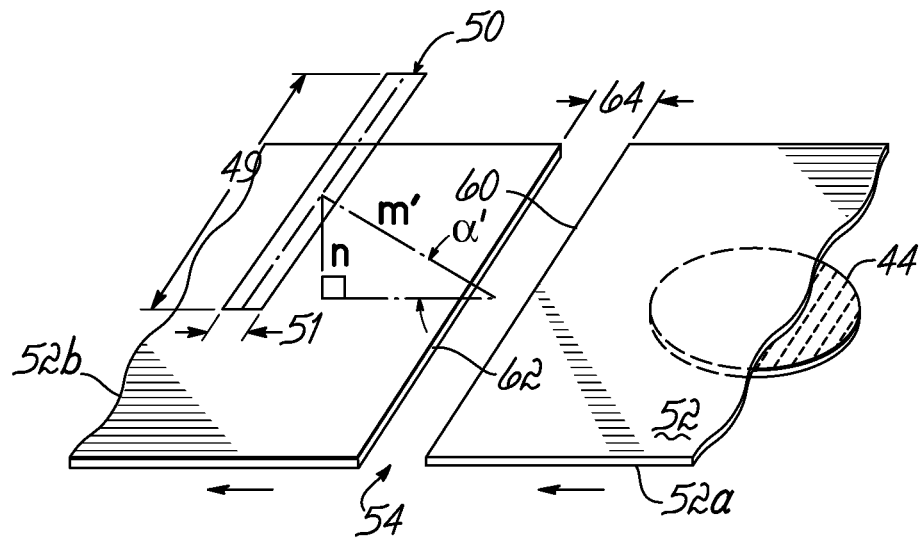
FIGS. 3B and 3C are diagrammatic perspective views of the shield of FIG. 3 showing the ability to adjust the position of the aperture relative to the source and the ability to adjust the width of the aperture, respectively.
Figure 3C:
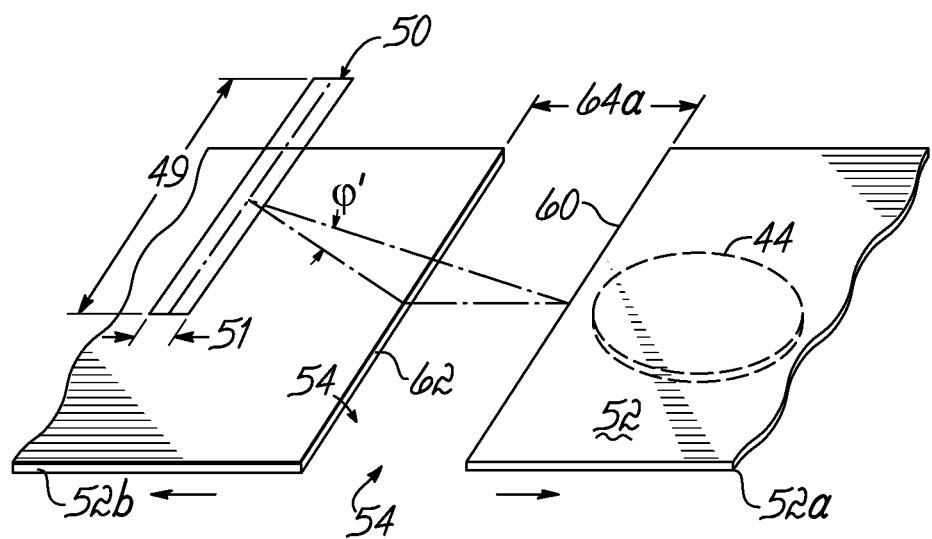

With reference to FIGS. 3B and 3C, the shield 52 may preferably include two members 52a, 52b that are relatively movable in a direction perpendicular to the major dimension 49 (FIG. 4A) of the source 50. The location of the aperture 54 may be adjusted relative to the source 50 by moving the members 52a, 52b toward or away from the source 50, as shown in FIG. 3B. This relocation of the aperture 54 is effective for changing the average incident angle of the beam 42 relative to the plane of the substrate 44. The movement of members 52a, 52b is illustrated as increasing the average incident angle relative to the arrangement shown in FIG. 4A, although not so limited. The minor dimension 64 (FIG. 4A) of aperture 54 may be adjusted by moving the members 52a, 52b relative to each other so that the distance between edges 60, 62 changes, as shown in FIG. 3C. This width adjustment of aperture 54 is effective for changing the collimation angle of the beam 42 across the treatment zone 38. The movement of members 52a, 52b is illustrated as increasing distance to provide a minor dimension 64a greater than minor dimension 64 (FIG. 4B), which increases the collimation angle relative to the arrangement shown in FIG. 4B. However, moving the edges 60, 62 of the members 52a, 52b closer together will decrease the collimation angle relative to the arrangement shown in FIG. 4B.

With reference to FIGS. 5-13 in which like reference numerals refer to like features in FIGS. 3, 3A, 4A, and 4B, a method of exposing the substrate 44 to a beam 42 of energetic particles is described that provides a symmetrical treatment profile on opposite sides of features 66 projecting upwardly from the substrate 44. Beam 42 will be described as a beam of deposition material that incrementally accumulates as a thin film on substrate 44, although the invention is not so limited. Alternatively, the beam 42 may etch the substrate 44 by sputtering, chemical reaction, or a combination thereof, remove contaminants from the surface of substrate 44, or perform another type of ion beam treatment of substrate 44. The method will be described in terms of a single processing cycle or sequence including two distinguishable half-cycles, which may be repeated or iterated to thicken the deposited thin film or achieve the desired surface treatment.

Figure 5:
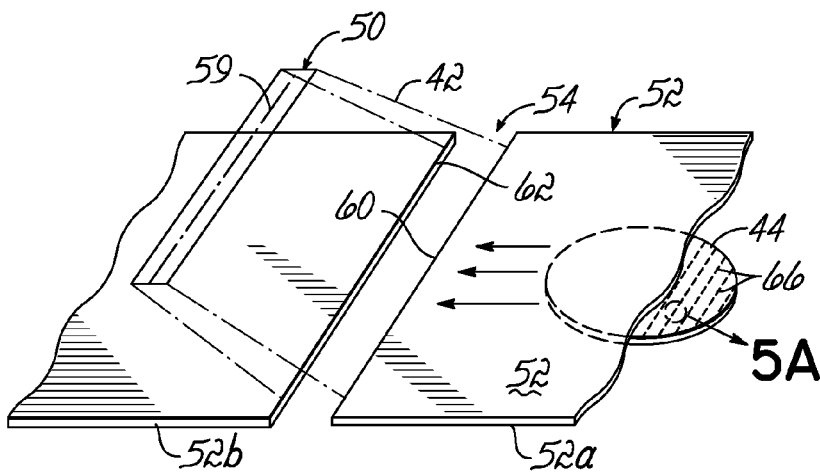
FIG. 5 is a diagrammatic perspective view of the substrate processing apparatus of FIG. 3 at an initial stage of a processing method in accordance with an embodiment of the invention.
Figure 5A:
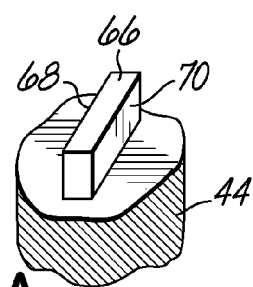
FIG. 5A is a detailed view of a portion of FIG. 5 illustrating the orientation of one of the features projecting from the substrate during processing.

With specific reference to FIGS. 5 and 5A, substrate 44 is loaded onto the fixture 55 in a home position in which the substrate 44 is shielded from source 50 by the shield 52. Accordingly, the beam 42 does not treat the substrate 44 in the home position. While the substrate 44 is stationary in the home position, the rotational stage 56 of fixture 55 orients substrate 44 about azimuthal axis 45 so that each of the features 66, exemplified by feature 66 visible in FIG. 5A, has opposite first and second sidewalls 68, 70 aligned generally parallel with the major dimension 65 of the aperture 54 and so that sidewall 68 is closest to edge 60.

The features 66 may be, for example, portions of a patterned photoresist layer. To that end, resist is applied by, for example, a spin-on process to substrate 44, exposed with radiation projected through a photomask to impart a latent projected image pattern characteristic of features 66, and developed to transform the latent image pattern into a final image pattern. The resist is stripped from the substrate 44 after the substrate 44 is treated by beam 42. The features 66 of the patterned resist may be used as a mask in a lift-off process following deposition of the layer 71 of deposition material in processing apparatus 40.

The source 50 is energized to generate the beam 42 of energetic particles, which are directed toward the rectangular aperture 54 in the shield 52. The projection of the beam 42 through the aperture 54 defines the treatment zone 38 in the plane of the substrate 44. The substrate 44, when positioned in the treatment zone 38 by fixture 55, is exposed to the energetic particles of beam 42.

Figure 6:
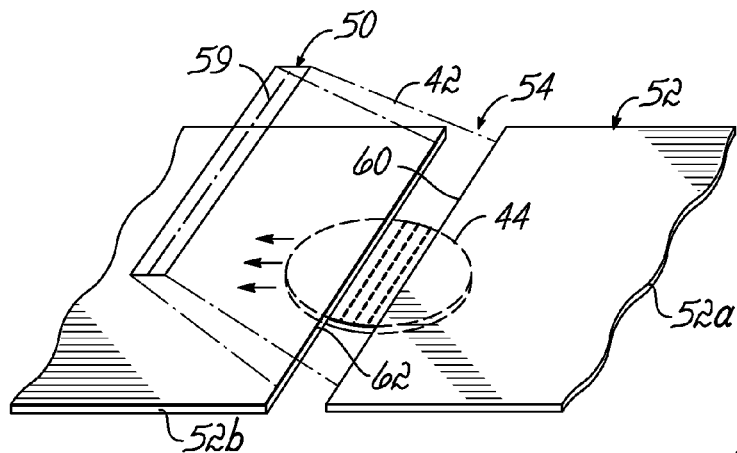
FIG. 6 is a diagrammatic perspective view of the substrate processing apparatus of FIG. 3 at a subsequent stage of the processing method.
Figure 6A:
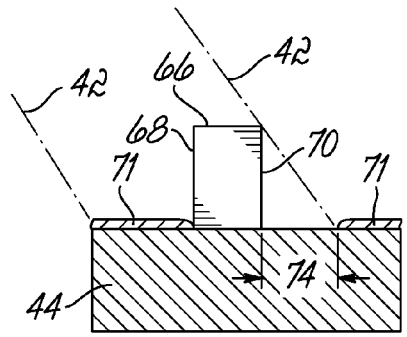
FIG. 6A is a cross-sectional view of the feature of FIG. 5A receiving treatment while being translated past the aperture during processing.

With reference to FIGS. 6 and 6A, the translation stage 58 of fixture 55 translates the substrate 44 in a plane below the shield 52 and past the rectangular aperture 54. The translation is in a direction substantially orthogonal to the major dimension 65 of the aperture 54. While the substrate 44 is in the line of sight between the source 50 and aperture 54, the beam 42 impinges the exposed surface of the substrate 44 and the energetic particles in the beam 42 provide the surface treatment. In this exemplary embodiment, the energetic particles in beam 42 are resident in a layer 71 of deposition material deposited on the substrate 44.

Layer 71 extends up to the base of the sidewall 68 of feature 66, as feature 66 does not block the line-of-sight of beam 42 to substrate 44 proximate to the base of sidewall 68. However, feature 66 shadows the substrate 44 adjacent to sidewall 70 over a width 74. As a result, energetic particles from beam 42 do not impinge the portion of substrate 44 adjacent to sidewall 70, and layer 71 does not accumulate or thicken over width 74 during this segment of the cycle.

Because each feature 66 is exposed continuously to beam 42 over the entire extent of the apparatus collimation angle (FIG. 4B), beam divergence across the minor dimension 64 (FIG. 4A) between edges 60, 62 does not cause variations in the profile of layer 71 adjacent to sidewall 70 among features 66 at different locations on substrate 44. In addition, the uniformity of the flux distribution of beam 42 along its major dimension 49 promotes uniformity in the profile and thickness of layer 71 across the surface of substrate 44.

Figure 7:
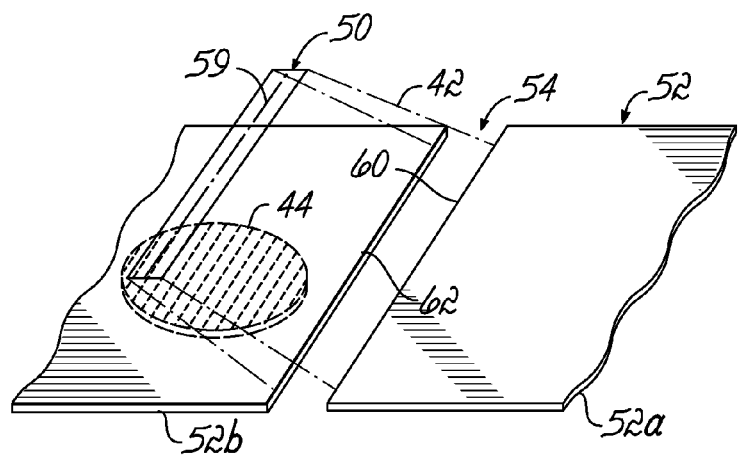
FIGS. 7-9 are diagrammatic perspective views of the substrate processing apparatus of FIG. 6 at subsequent stages of the processing method.
Figure 8:
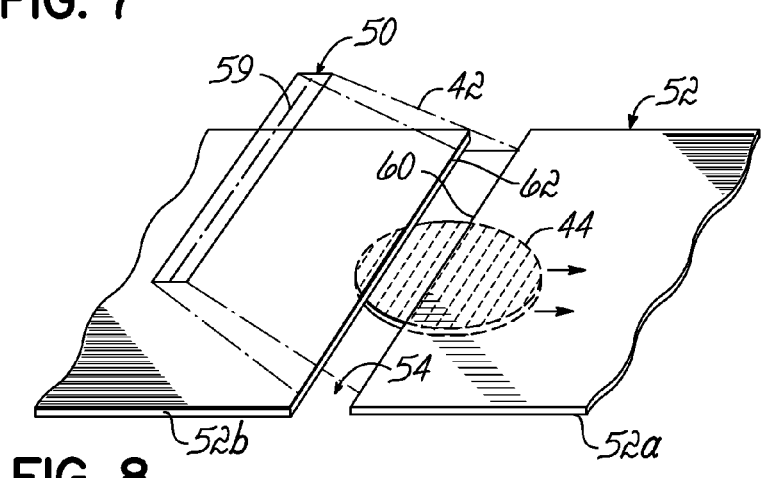

With reference to FIGS. 7 and 8, the motion of the translation stage 58 is stopped at an end point beneath the shield 52 after passing the rectangular aperture 54. At the end point, the substrate 44 is stationary and the beam 42 is blocked by shield 52 from reaching substrate 44. The translation direction of stage 58 is then reversed so that the substrate 44 moves back toward the rectangular aperture 54 in a direction again substantially orthogonal to the major dimension 65 of the aperture 54. The exposed surface of substrate 44 is again exposed to beam 42 while in the treatment zone 38 so that the energetic particles in the beam 42 provide the surface treatment. Another thickness of layer 71 deposits on the substrate 44. Layer 71 again accumulates or thickens uniformly up to the base of sidewall 68 because, over the return path to the home position, feature 66 still does not block the line-of-sight of beam 42 to substrate 44 proximate to the base of sidewall 68. However, the feature 66 again shadows the substrate 44 adjacent to sidewall 70 over width 74. As a result, energetic particles from beam 42 do not impinge the portion of substrate 44 adjacent to the base of sidewall 70 and, therefore, layer 71 does not accumulate or thicken over width 74 during this segment of the processing cycle.

Figure 9:
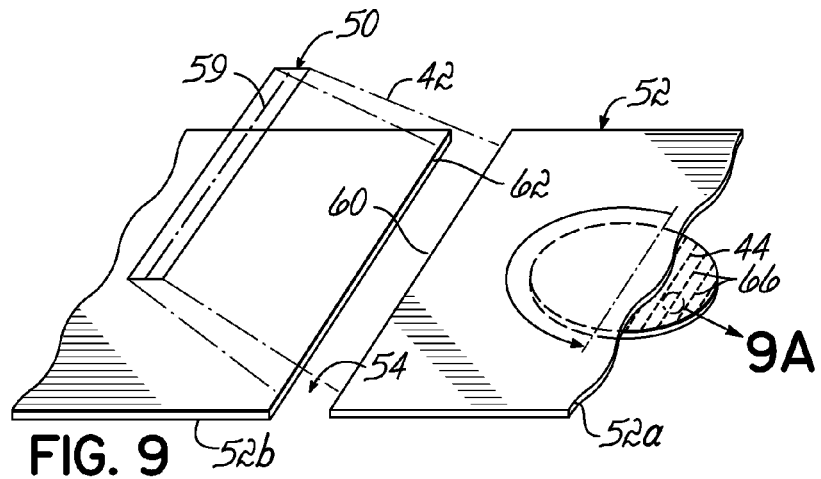
Figure 9A:
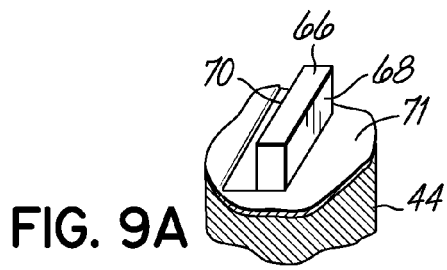
FIG. 9A is a detailed view illustrating the feature of FIG. 6A during processing after the substrate is rotated by 180° and immediately before the second half-cycle of the processing cycle.

With reference to FIG. 9, the translation stage 58 returns the substrate 44 to its home position in which beam 42 is blocked by shield 52 from reaching the substrate 44. While the fixture 55 is stationary in this home position, the rotational stage 56 rotates the substrate 44 by 180° about azimuthal axis 45 so that sidewall 70 is closest to edge 60 and sidewall 68 is remote from edge 60. The sidewalls 68, 70 are aligned generally parallel with the major dimension 65 of the aperture 54 after the 180° rotation.

Figure 10:
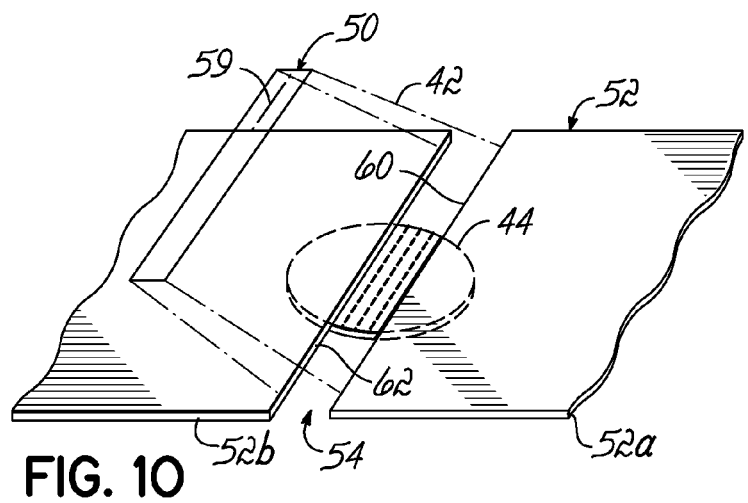
FIG. 10 is a diagrammatic perspective view of the substrate processing apparatus of FIG. 9 at a subsequent stage of the processing method.
Figure 11:
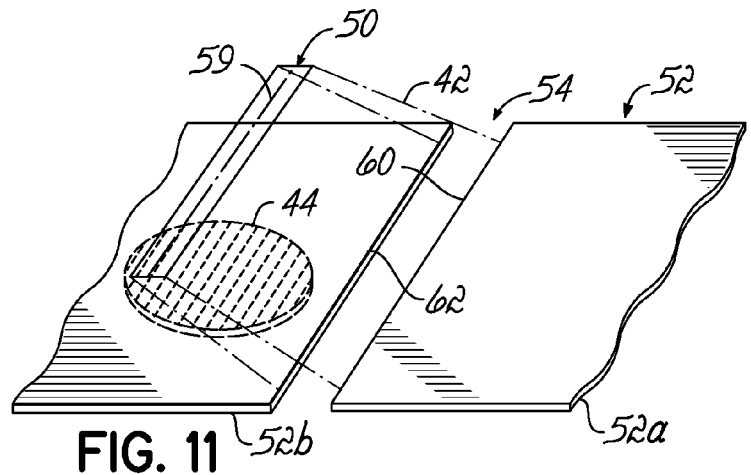
FIGS. 11-13 are diagrammatic perspective views of the substrate processing apparatus of FIG. 10 at subsequent stages of the processing method.
Figure 12:
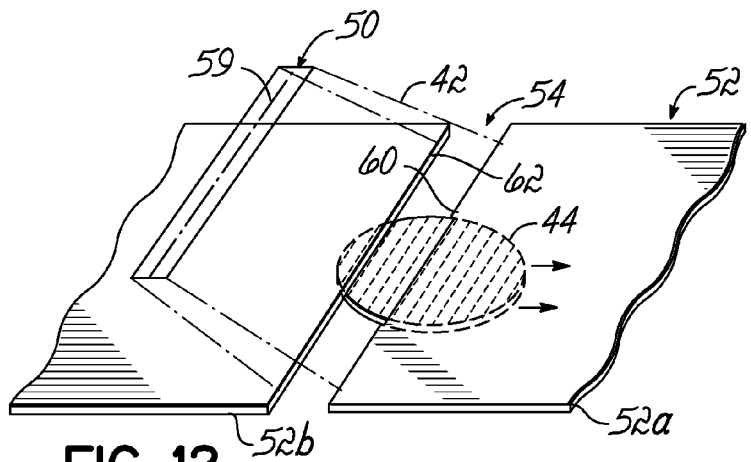

With reference to FIGS. 10-12, the procedure shown in FIGS. 6-8 is repeated so that the region of substrate 44 adjacent to the base of sidewall 70 (i.e., width 74 shown in FIG. 6A) receives a surface treatment identical to the region of substrate 44 adjacent to the base of sidewall 68 (i.e., width 72). In other words, the widths 72 and 74 are equal, neglecting the thickness of layer 71 forming on the substrate 44 across widths 72 and 74. While the substrate 44 is positioned beneath aperture 54 (FIGS. 10 and 12), energetic particles from the beam 42 treat the substrate 44. Accordingly, another thickness of layer 71 deposits on the substrate 44.

Layer 71 thickens up to the base of sidewall 70 over each of the two passes beneath the aperture 54 because feature 66 does not block the path of beam 42 to substrate 44 adjacent to the base of sidewall 70. However, feature 66 shadows the substrate 44 adjacent to sidewall 68 over width 72. As a result, energetic particles from beam 42 do not impinge the portion of layer 71 adjacent to sidewall 68 and layer 71 does not accumulate or thicken over width 72 during these segments of the cycle.

Figure 13:
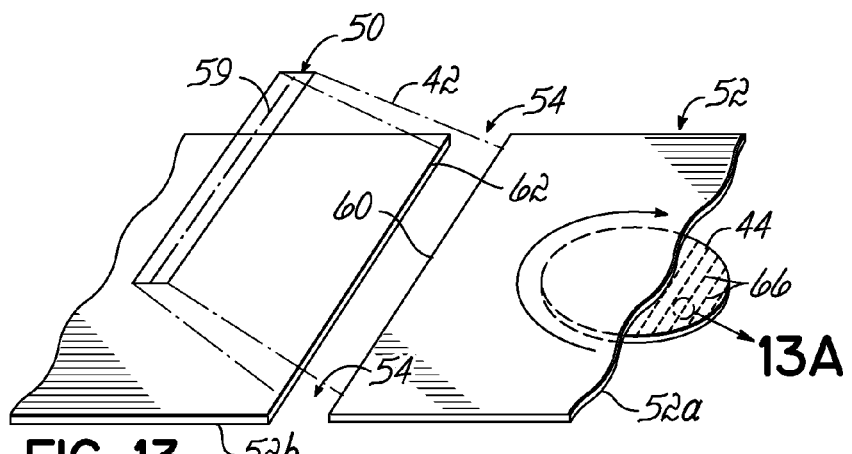
Figure 13A:
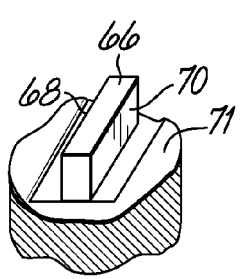
FIG. 13A is a detailed view of a portion of FIG. 13 illustrating feature orientation during processing and after a full cycle.

When the substrate 44 is returned by the translation stage 58 to the home position in FIG. 13, the rotational stage 56 rotates the substrate 44 by 180° about azimuthal axis 45 so that sidewall 68 of feature 66 is again closest to edge 60. The procedure embodied in the segments of FIGS. 5-13 is repeated for a number of cycles sufficient to achieve a targeted processing result. For example and as described, the procedure may be repeated for a number of cycles sufficient to provide a targeted thickness of material deposition. Feature 66 may be removed from substrate 44 after the targeted thickness of deposition material in layer 71 is achieved.

In an alternative embodiment of the invention, the half-cycle depicted in FIGS. 6-8 may be repeated for a number of passes past aperture 54 with sidewalls 68, 70 aligned generally parallel with the major dimension 65 of the aperture 54 and sidewall 68 nearest to edge 60 and the substrate 44 rotated by 180° about azimuthal axis 45. Then, the half-cycle depicted in FIGS. 10-12 repeated for a substantially equivalent number of passes with sidewalls 68, 70 aligned generally parallel with the major dimension 65 of the aperture 54 and sidewall 70 nearest to edge 60. Preferably, the two half-cycles of the sequence alternate as described herein. In other words, the substrate 44 is translated through the treatment zone 38 a plurality of times before being rotated by 180° about azimuthal axis 45 to re-orient the features 66.

The result of the processing procedure is that neither sidewall 68, 70 constitutes an inboard or outboard side of feature 66 as the features 66 are alternatively aligned relative to the major dimension 65 (FIG. 4A) of the aperture 54 and translated relative to beam 42. This results in a symmetrical deposition or treatment profile on substrate 44 adjacent to the sidewalls 68, 70 of feature 66. In addition, the deposition or processing profile does not exhibit a radial dependence relative to the center of substrate 44.

In an alternative embodiment, the processing apparatus 40 may be employed to perform a static etch or other wafer surface treatment under oblique beam incidence. This embodiment eliminates the 180° rotation of substrate 44 about azimuthal axis 45 in the home position after the conclusion of each half cycle. With reference to either the half cycle shown in FIGS. 5-9 or the half cycle shown in FIGS. 9-13, the substrate 44 is translated past the aperture 54 without using rotational stage 56 to change the angular orientation of the substrate 44.

In another alternative embodiment of the invention, the substrate 44 may be held stationary and the source 50 and aperture 54 are moved relative to the substrate 44 so that the deposition flux is scanned across the surface of the substrate 44.

Figure 14:
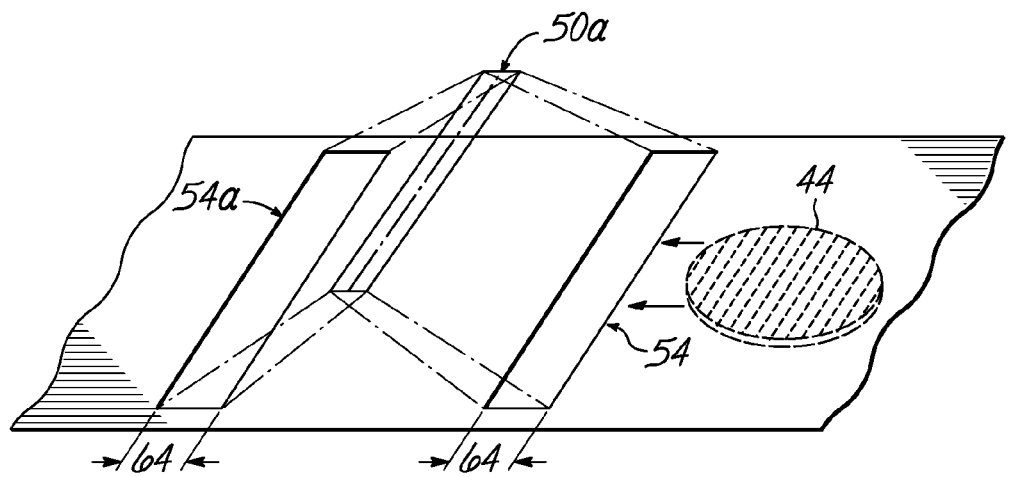
FIGS. 14 and 14A are diagrammatic perspective views of a substrate processing apparatus in accordance with an alternative embodiment of the invention.
Figure 14A:
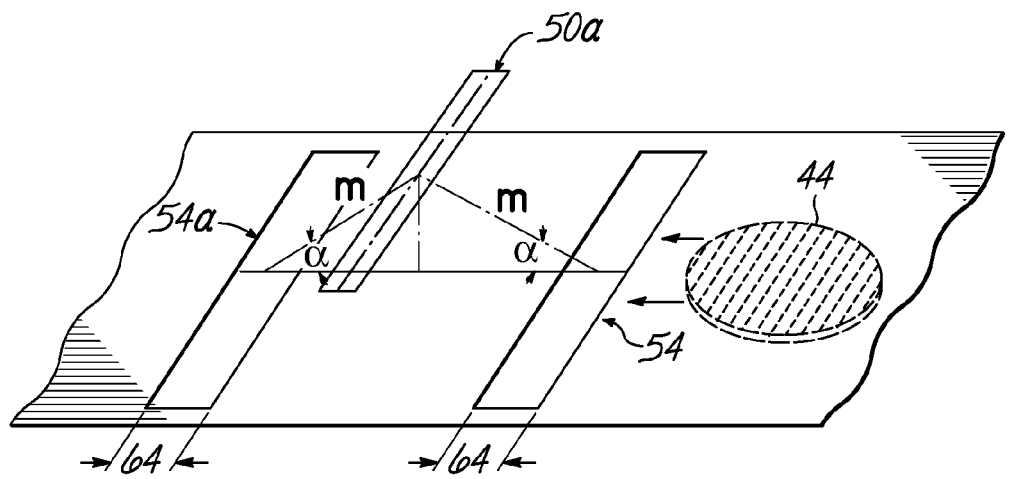

With reference to FIGS. 14 and 14A in which like reference numerals refer to like features in FIGS. 3-13 and in accordance with an alternative embodiment of the present invention, the beam 42 emitted by a source 50a has a flux distribution of energetic particles that is symmetrical relative to the plane of the motion of fixture 55. Shield 52 includes a second rectangular aperture 54a that is identical in major dimension 64 and minor dimension 65 to rectangular aperture 54. The rectangular apertures 54, 54a are preferably positioned symmetrically relative to the centerline 59 of the source 50 (i.e., symmetrically to energetic particles plume distribution), although the invention is not so limited. This symmetry causes the surface treatment (e.g., deposition or etch) to be substantially identical adjacent to both sidewalls 68, 70 (FIG. 5A) of feature 66 when the substrate 44 is translated by the translation stage 58 past the rectangular apertures 54, 54a. This embodiment of the invention does not require a 180° rotation about azimuthal axis 45 to produce symmetrical substrate treatment proximate to the base of the sidewalls 68, 70 of features 66 projecting from substrate 44.

Figure 15:
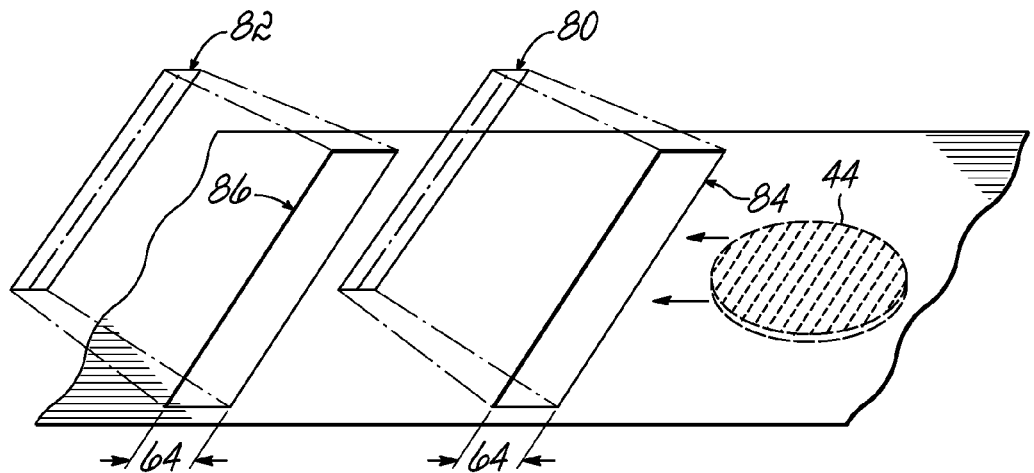
FIG. 15 is a diagrammatic perspective view of a substrate processing apparatus in accordance with another alternative embodiment of the invention.

With reference to FIG. 15 in which like reference numerals refer to like features in FIGS. 3-13 and in accordance with an alternative embodiment of the present invention, the vacuum chamber 46 of processing apparatus 40 may include a plurality of at least two sources 80, 82, each of which is substantially identical to source 50, in which the emitted energetic particles may have different or identical characteristics. Associated with each source 80, 82 is a corresponding one of at least two rectangular apertures 84, 86, each of which is substantially identical to aperture 54. The processing apparatus 40 is configured and the source 80 and aperture 84 are arranged such that substrate 44 is impinged by energetic particles from source 80 only when in the line-of-sight of source 80 as viewed through aperture 84. Similarly, processing apparatus 40 is configured and source 82 and aperture 86 are arranged such that substrate 44 is impinged by energetic particles from source 82 only when in the line-of-sight of source 82 as viewed through aperture 86. The sources 80, 82 may be used to deposit individual layers of a multilayer structure. Alternatively, source 80 may be used to etch substrate 44 and source 82 may be used to deposit a layer on substrate 44, or source 80 may deposit a layer on substrate 44 and source 82 may be used to ion beam process the layer on substrate 44 under an oblique angle of incidence. Other combinations of surface treatments are contemplated by the invention, as is the presence of more than two sources and associated apertures inside vacuum chamber 46 for depositing additional layers, performing additional dry etches, or otherwise ion beam processing the substrate 44.

Figure 16:
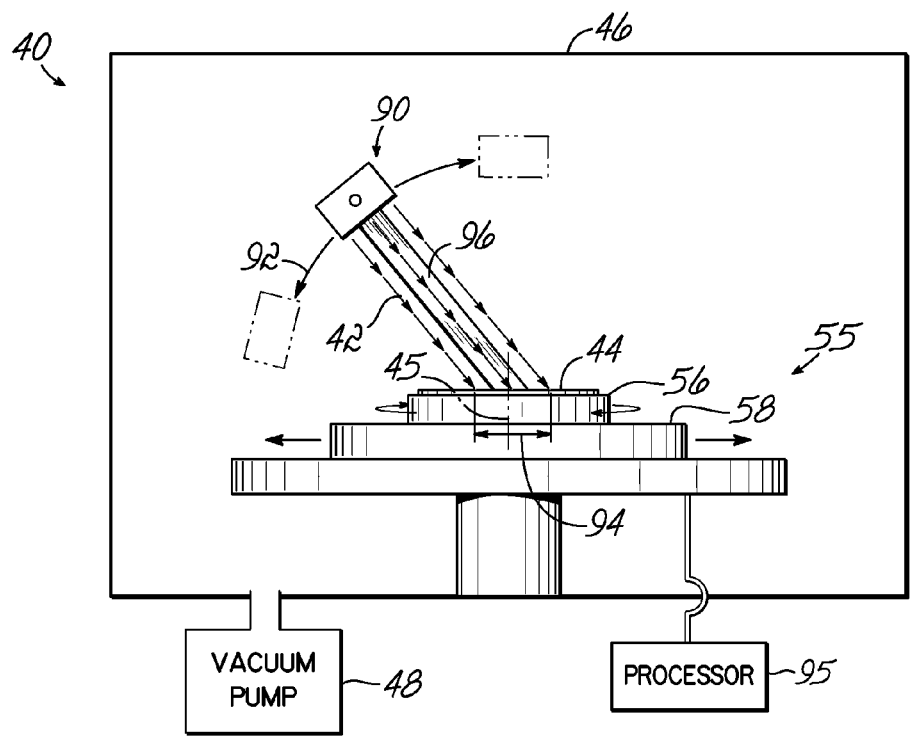
FIG. 16 is a diagrammatic side view of a substrate processing apparatus in accordance with an alternative embodiment of the invention.
Figure 16A:
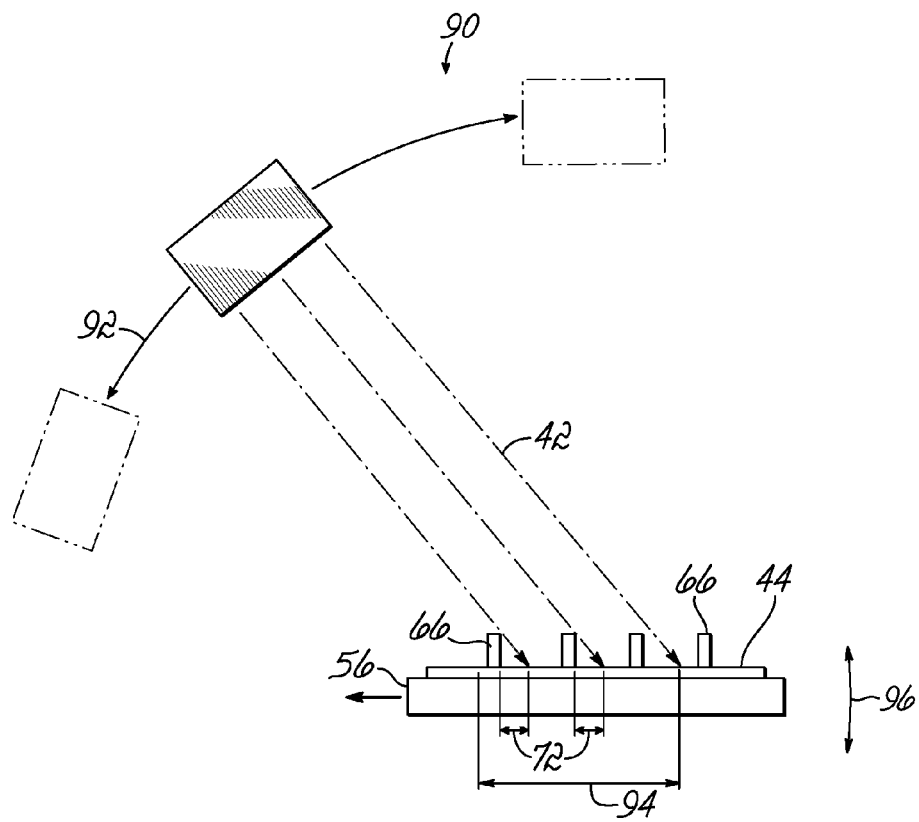
FIG. 16A is an enlarged view of a portion of FIG. 16.
Figure 16B:
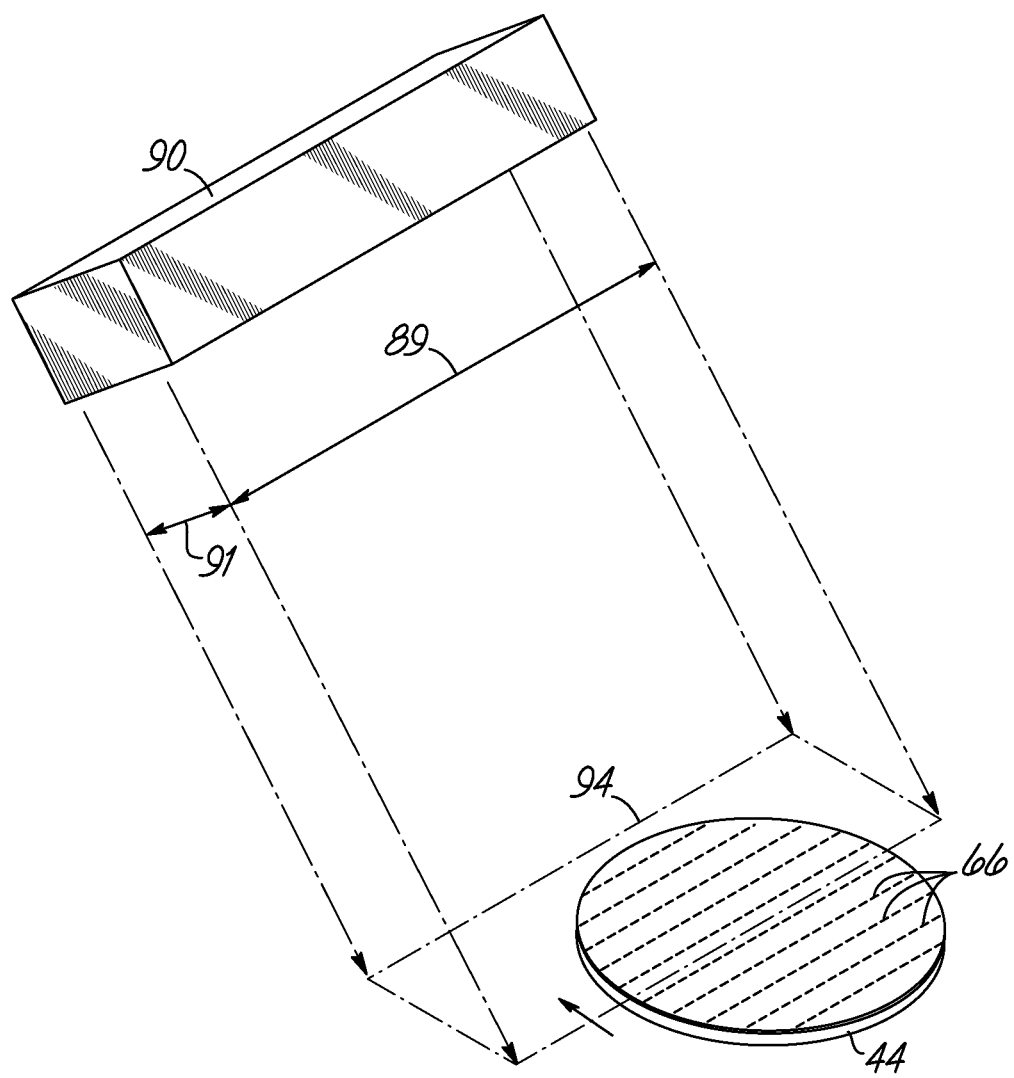
FIG. 16B is a diagrammatic perspective view of the substrate processing apparatus of FIG. 16.

With reference to FIGS. 16, 16A, and 16B in which like reference numerals refer to like features in FIGS. 3-13 and in accordance with an alternative embodiment of the present invention, the shield 52 (FIGS. 3, 3A-C) may be omitted from the vacuum chamber 46 of processing apparatus 40 while retaining the advantages characteristic of the present invention. To that end, the processing apparatus 40 is provided with a source 90, which is preferably rectangular but not so limited, that is adapted to emit the beam 42 of energetic particles with a substantially uniform flux distribution along at least a portion of a major dimension 89 of the source 90 (FIG. 16B). The beam 42 is confined parallel to the direction of motion of the substrate 44 and shaped to provide the substantially uniform flux distribution along at least a portion of the major dimension 89. The source 90 is also characterized by a minor dimension 91 (FIG. 16B) orthogonal to the major dimension 89. The energetic particles from source 90 may etch substrate 44, deposit a thin film or layer of material on substrate 44, or otherwise treat substrate 44, as understood by a person having ordinary skill in the art. Eliminating the shield 52 may be advantageous for reducing the likelihood of substrate contamination originating from material physically sputtered from such shields.

Linear ion sources 90 suitable for surface treatments like etching include, but are not limited to, the product line of linear anode layer ion sources commercially available from Veeco Instruments Inc. (Woodbury, N.Y.), which have beam energies between 100 eV and 1800 eV and beam currents up to 30 mA/linear cm. The beam 42 in these linear ion sources 90 has a high aspect ratio such that the cross-sectional profile of the beam 42 is larger in one dimension than the other. The substrate 44 is translated in a single dimension through the beam 42. In these instances, the cross-sectional profile of the beam 42 has one dimension that is larger than one dimension of the substrate 44. As a result, in one or more passes through the beam 42, the substrate 44 receives a uniform dose of ions.

The substrate 44 is impinged by energetic particles in the beam 42 from source 90 across a treatment area or zone 94 defined in the plane of substrate 44 as the substrate 44 is moved back-and-forth and optionally periodically rotated as described herein. Treatment zone 94 may be considered to extend over the entire region across which the moving substrate 44 is exposed to the beam 42 during each scan. The substantially uniform portion of the source 90 is positioned over treatment zone 94 such that the flux distribution of the source 90 over the treatment zone 94 is substantially uniform along the major dimension 89 of the source 90. The capability of the source 90 to emit the beam 42 of energetic particles with a substantially uniform flux distribution along at least a portion of the major dimension 89 eliminates the need to provide shield 52 for beam confinement, shaping, and collimation. Alternatively, the translation stage 58 of fixture 55 may be adapted to translate the substrate 44 in an arc relative to the major dimension 89 of the source 90, as opposed to the illustrated back-and-forth movement.

The energetic particles in beam 42 emitted by source 90 have a substantially uniform incident angle, measured relative to a surface normal of the substrate 44 or relative to the plane of the substrate 44, at the substrate 44 over the entire treatment zone 94 and across the major dimension 89. This is possible because source 90 emits energetic particles with parallel or substantially parallel trajectories and a small beam divergence. The distance between the substrate 22 and source 90 is optimized in view of the source strength and beam divergence. Source 90 may include a flat optical grid or dished grid optics to enhance collimation for providing the parallel or substantially parallel trajectories and small beam divergence, as understood by a person having ordinary skill in the art. The shaped beam 42 from source 90 defines the treatment zone 94.

The substrate 44 is scanned through the treatment zone 94, in the various manners described herein, to expose the features 66 and the substrate 44 surrounding features 66 to the energetic particles in beam 42. When the substrate 44 is outside of the treatment zone 94, the substrate 44 is either not exposed to beam 42 or exposed to only a negligible energetic particle dose. The portion of the energetic particle flux distribution outside of the treatment zone 94 is typically less than about 10 percent of the total ion flux distribution.

Figure 10A:
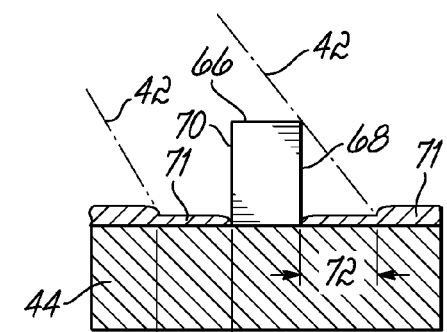
FIG. 10A is a cross-sectional view of the feature of FIG. 9A receiving treatment while being translated past the aperture with the feature reoriented by 180°.

The substrate 44 may be rotated or indexed in its plane about its azimuthal axis 45 between consecutive scans through the treatment zone 94. More specifically, the substrate 44 may be rotated or indexed about its azimuthal axis 45 at or near the end of the range of motion (i.e., linear stroke) of the substrate 44 because the features 66 are asymmetrical (e.g., elongated heads). If fixture 55 is operating in this manner, the rotational stage 56 rotates or indexes the substrate 44 about its azimuthal axis 45 by 180° at a location outside of the treatment zone 94 and between consecutive scans through treatment zone 94, as described herein. This aligns the features 66 on substrate 44 relative to the major dimension 89 of source 90 and, consequently, beam 42 as the substrate 44 is scanned either linearly or in an arc through the treatment zone 94. After processing is completed, the surface treatment of width 72 on substrate 44 adjacent to the base of sidewall 68 and the similar width 74 (FIGS. 6A, 10A) is substantially uniform because of the changes in the feature alignment by rotation outside of treatment zone 94. A processor 95 is provided that controls the operation of the rotational stage 56 and the translation stage 58 such that the substrate 44 is translated through the treatment zone 94 with a fixed angular orientation of the translation stage 58 about the azimuthal axis 45.

The surface treatment of substrate 44 is also substantially uniform because of the substantially uniform flux distribution of beam 42 along the major dimension 89 of the source 90. Any non-uniformity in the flux distribution of the beam 42 in the minor dimension 91 is averaged by the movement of the substrate 44 through the treatment zone 94.

The source 90 may be moved among various positions defined generally along an arc 92, which is effective for adjusting the average incident angle of the energetic particles in beam 42 in treatment zone 94 in a direction parallel to the direction of motion of substrate 44 and the minor dimension 91 of source 90. To that end, opposite ends of the source 90 are each supported on a corresponding one of a pair of arms, of which arm 96 is visible in FIG. 16, that may be pivoted relative to the linear path of the substrate 44. The source 90 is stationary during substrate processing. A plasma bridge neutralizer (not shown) may be associated with the source 90 and may be pivoted along with the source 90.

The substrate 44 may need to be moved large distances to completely pass the substrate 44 out of the beam 42 at each end of the range of movement. The distance that the substrate 44 must move to be completely removed from the beam 42 may be affected by the angle between the beam direction and the plane of substrate motion.

Figure 17:
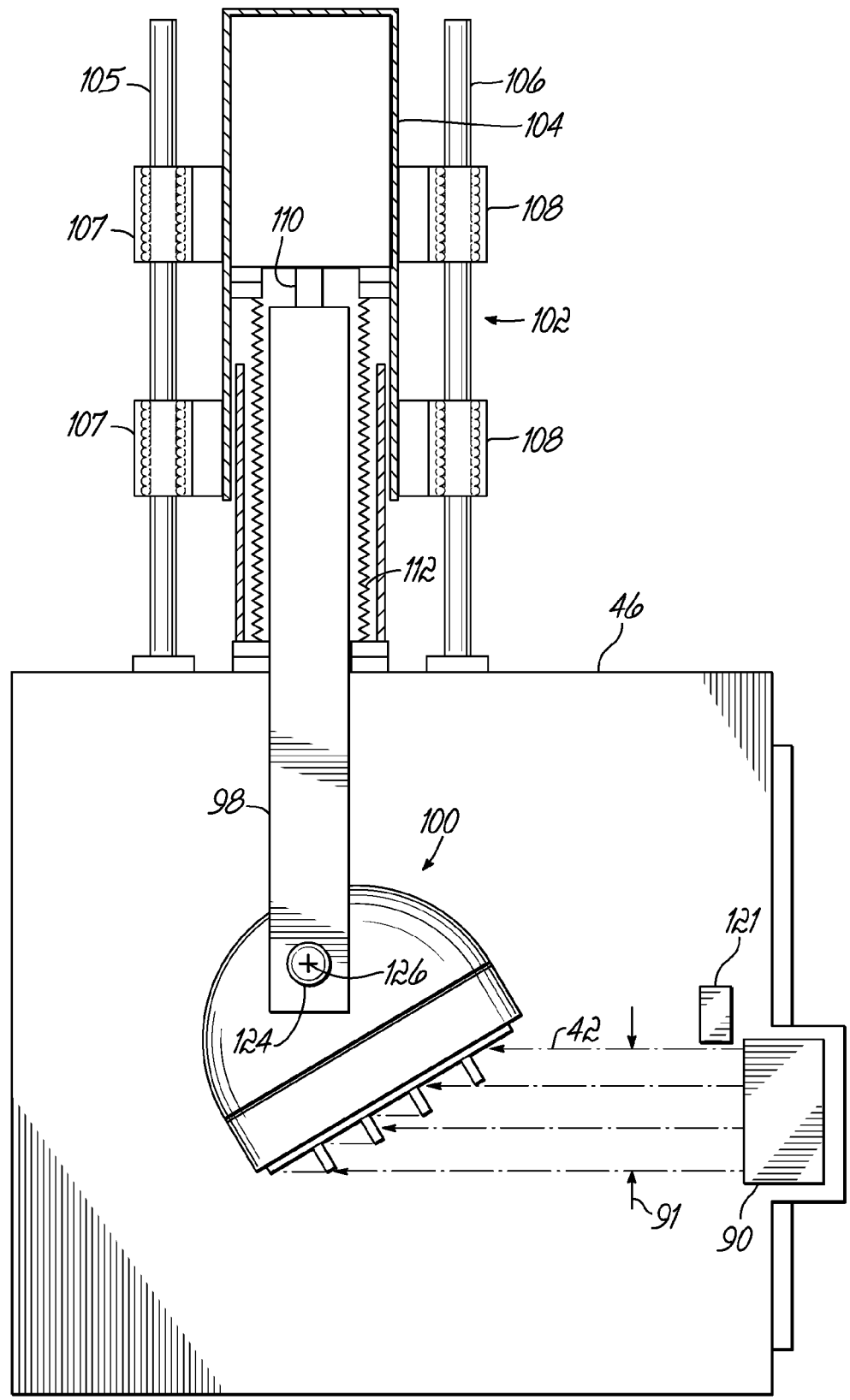
FIG. 17 is a diagrammatic bottom view of a substrate processing apparatus in accordance with an alternative embodiment of the invention.

With reference to FIG. 17 in which like reference numerals refer to like features in FIGS. 16, 16A, and 16B and in accordance with an alternative embodiment of the present invention, a fixture 100 is adapted to hold and support the substrate 44 for movement relative to the source 90, which includes a plasma bridge neutralizer 121. The fixture 100 is supported at one end of an arm 98 extending from a linear actuator 102 that moves the fixture 100 in a linearly and bi-directionally (i.e., reversibly) or back and forth (i.e., reciprocating) manner along an axis 101 relative to the source 90. The linear actuator 102 may include a drive mechanism 104 having a driven output 110 coupled with the arm 98 and a pair of stationary rails 105, 106 to which the drive mechanism 104 and arm 98 are coupled for movement by bearings 107, 108, respectively. A bellows 112 supplies a vacuum-tight connection with the vacuum chamber 46 and is compliant with the bi-directional movement of the linear actuator 102.

The bi-directional motion of fixture 100 may be used to repetitively scan the substrate 44 through the treatment zone 94, as described above with regard to fixture 55 (FIGS. 3, 3A). In this operational mode, the linear actuator 102 translates the substrate 44 in a direction approximately orthogonal to the major dimension 89 (FIG. 16B) of source 90. After processing is concluded, the surface treatment of width 72 on substrate 44 adjacent to the base of sidewall 68 and the similar width 74 (FIGS. 6A, 10A) is substantially uniform because of the changes in the feature alignment by rotation outside of treatment zone 94.

Figure 18:
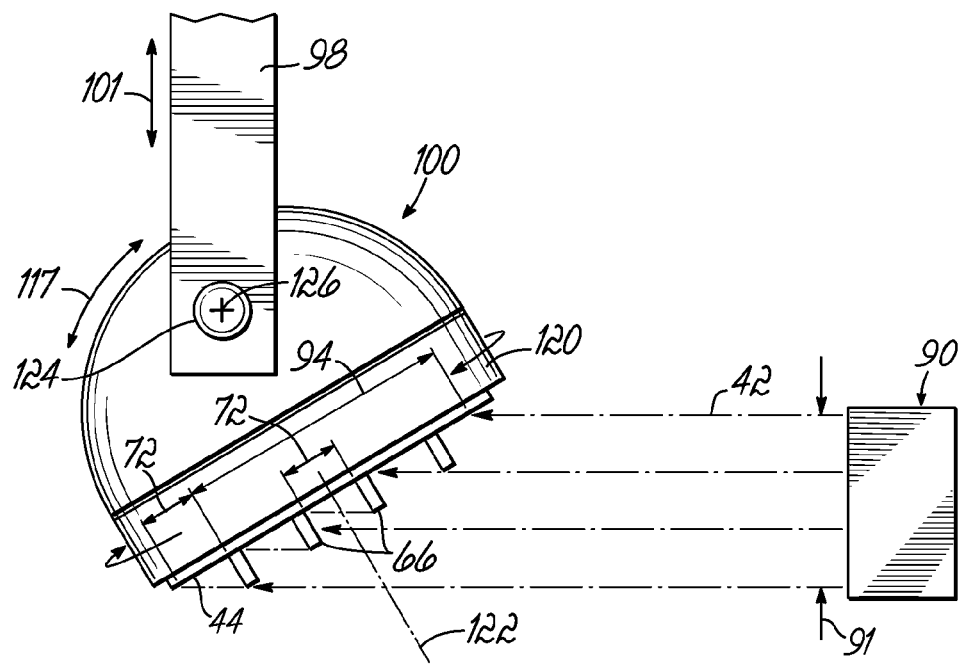
FIG. 18 is an enlarged diagrammatic top view of a portion of FIG. 17.

With reference to FIGS. 17 and 18, the fixture 100 includes a rotational stage 120 adapted to rotate the substrate 44 in at least one rotational sense about an azimuthal axis 122 of the rotational stage 120. Rotational stage 120 operates in a manner similar to rotational stage 56 (FIGS. 3, 3A) of fixture 55. Rotation of the substrate 44 about the azimuthal axis 122, when the substrate 44 is outside of the treatment zone 94, changes the orientation of features 66 (FIG. 5A) on the substrate 44 relative to the direction of the beam 42. The azimuthal axis of the rotational stage 120 coincides with the azimuthal axis 45 of substrate 44. The movements of rotational stage 120 and the arm 98 as driven by the linear actuator 102 are mutually independent so that the substrate 44 may be translated without rotation and, conversely, the substrate 44 may be rotated without translation.

The rotational stage 120 of the fixture 100 is pivotally mounted by a gimbal or pivoting coupling 124 with the arm 98 of the linear actuator 102. The pivoting coupling 124 provides the fixture 100 with the ability to angularly orient the azimuthal axis 122 of the rotational stage 120 and, hence, the substrate 44 about an axis 117 that is substantially orthogonal to axis 101. Tilting the azimuthal axis 122 of the rotational stage 120 changes the incident angle of the beam 42 relative to the azimuthal axis 122 of the rotational stage 120. The ability to tilt the substrate 44 effectively shortens the stroke of the linear actuator 102 because the substrate 44 may be translated linearly over a shorter distance to place the substrate 44 outside of the treatment zone 94. The tilting of the rotational stage 120 about the axis 117 is substantially parallel to the major dimension 89 of source 90, which operates to maintain the effective substantial uniformity of the beam 42 at the substrate 44.

Figure 19:
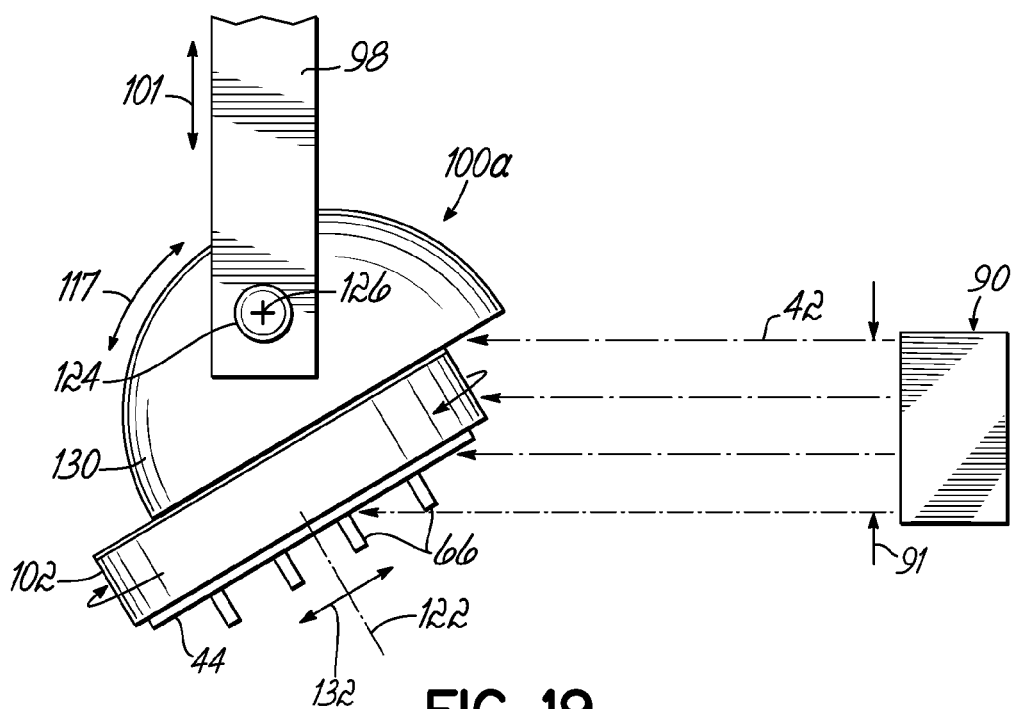
FIG. 19 is a diagrammatic top view of a portion of similar to FIG. 18 in accordance with an alternative embodiment of the invention.

With reference to FIG. 19 in which like reference numerals refer to like features in FIG. 18 and in an alternative embodiment of the present invention, a fixture 100a is depicted that is similar to fixture 100. The rotational stage 120 of fixture 100a is supported on a base 130 that permits motion of the rotational stage 120 in a plane that is perpendicular to the azimuthal axis 122. To that end, fixture 100 is provided with a mechanism that permits bi-directional translation of the rotational stage 120 relative to base 130 in a direction toward and away from the source 90 when the azimuthal axis 122 is inclined relative to the direction of beam 42. This additional degree of freedom is indicated diagrammatically in FIG. 19 by the double-headed arrow 132.

Embodiments of the present invention provide improvements in treatment uniformity, feature dimension control, and symmetry of the treatment properties for symmetrical features on a substrate as found in various data storage and semiconductor structures. Embodiments of the present invention are particularly advantageous for processing large surface-area substrates, such as 300 mm or larger wafers. In particular, embodiments of the present invention facilitate ion beam etching of (or deposition on) such substrates with treatment uniformity, feature dimension control, and symmetry in treatment properties for symmetrical surface features.

Figure 20:
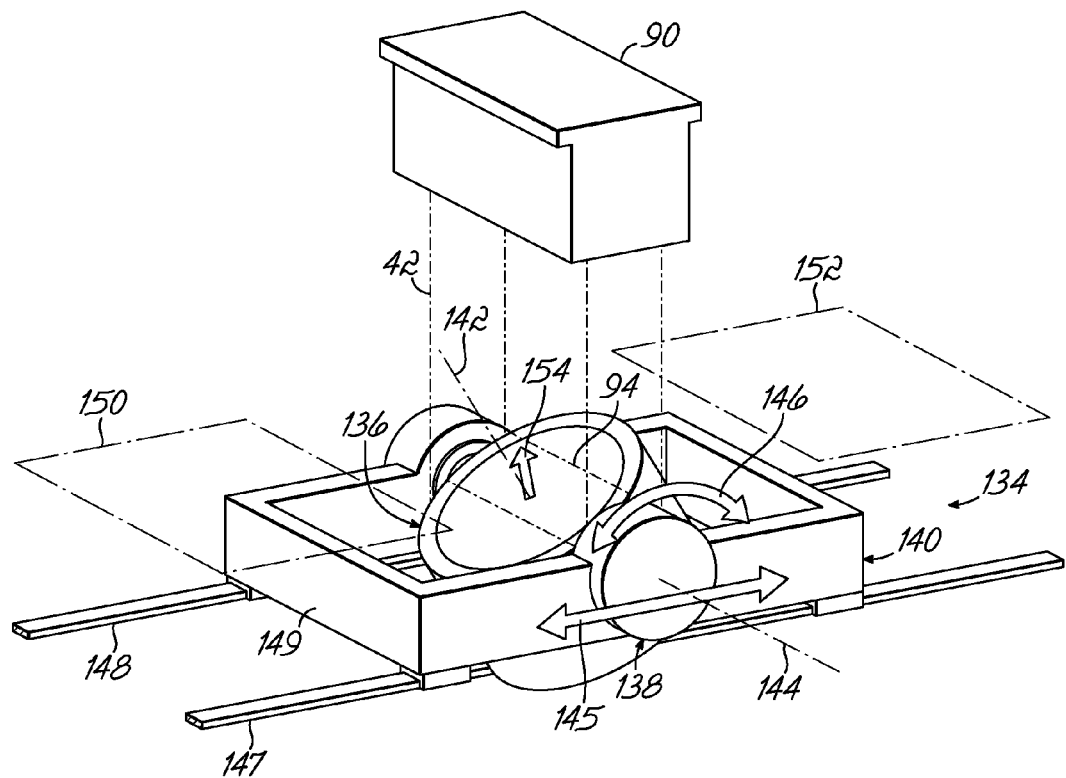
FIG. 20 is a diagrammatic perspective view of a substrate processing apparatus in accordance with an alternative embodiment of the invention.

With reference to FIG. 20 in which like reference numerals refer to like features in FIGS. 1-19 and in an alternative embodiment of the present invention, a multiple-stage platform or fixture 134 is used in conjunction with processing apparatus 40 (FIG. 3) to hold the substrate 44 with three-dimensional features 66 in place and to control its position with three controlled axes of motion. The fixture 134 includes a rotational stage 136, a tilt stage 138, and a translation stage 140 adapted to translate the rotational and tilt stages 136, 138 relative to the ion source 90 and, in particular, to translate the substrate 44 substantially perpendicular to the major dimension 89 (FIG. 16B) of ion source 90. The movements of the substrate 44 by the stages 136, 138, 140 are mutually independent.

The rotational stage 136 is adapted to rotate the substrate 44 in at least one rotational sense about an azimuthal axis 142 of stage 136, which coincides generally with the azimuthal axis 45 of substrate 44. A rotary actuator built into the rotational stage 136 is controlled to provided indexed rotation of the substrate 44 and a portion of the rotational stage 136 physically holding the substrate 44 about the azimuthal axis 142. The tilt stage 138 is adapted to tilt the rotational stage 136 about a tilt axis 144. Another rotary actuator built into the tilt stage 138 is controlled to tilt the tilt stage 138 and substrate 44 about the tilt axis 144, as indicated diagrammatically by double headed arrow 146.

The movement of the translation stage 140 is linear and bi-directional (i.e., reversible) relative to the major dimension 89 (FIG. 16B) of ion source 90, as indicated diagrammatically by double headed arrow 145. In particular, the translation stage 140 translates the substrate 44 in a direction approximately orthogonal to the major dimension 89 (FIG. 16B) of ion source 90. In the representative embodiment, the translation stage 140 includes a pair of adjacent, parallel rail guides 147, 148 and a carriage 149 coupled with the rail guides 147, 148 for guided linear translation relative to the rail guides 147, 148. A bi-directional linear actuator (not shown) is coupled with the carriage 149 and is operated to cause the carriage 149 to translate relative to the rail guides 147, 148. The range of travel for the translation stage 140, when the fixture 134 is operated to adjust the position of the substrate 44, is selected such that substrate 44 is positioned in parking areas 150, 152 on opposite sides of the treatment zone 94 that are out of the beam 42.

Indexing the substrate 44 by rotation about the azimuthal axis 142 changes the orientation of features, such as features 66 (FIG. 5A), on the substrate 44 relative to the direction of the beam 42 (FIGS. 3, 3A). The change in angular orientation may differ from 180° if asymmetry perpendicular to the scan direction is important, as described hereinbelow.

In an alternative embodiment, the translation stage 140 may be replaced by a planetary stage (not shown) that revolves the substrate 44 and stages 136, 138 about a relatively large radius of curvature in a plane parallel to the substrate plane. The radius of the curve traced by the substrate 44, when moved by the planetary stage, is large enough to be approximately linear over the minor dimension 64 of aperture 54. Preferably, the center of the source 50 and aperture 54, and the arc traced by the center of fixture 134 are in a cylindrical plane with a radius of curvature exceeding the distance between the source 50 and aperture 54.

Figure 21:
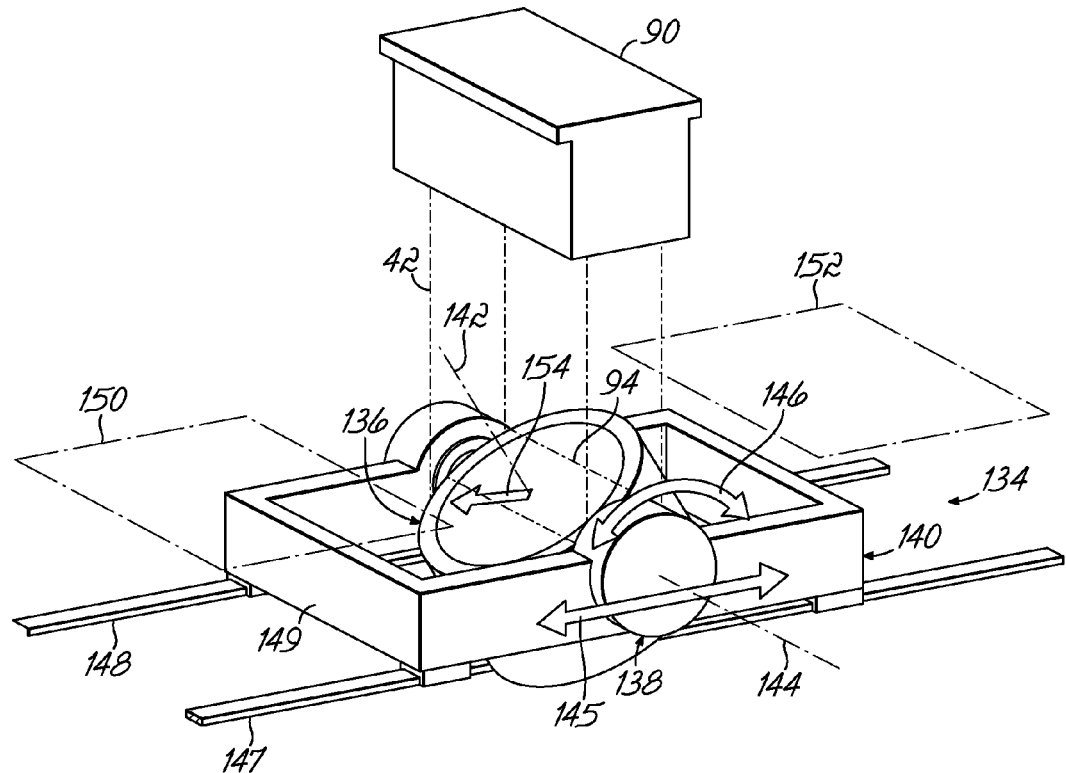
FIGS. 21 and 22 are diagrammatic perspective views similar to FIG. 20 at subsequent stages of a substrate processing method in accordance with an alternative embodiment of the invention.
Figure 22:
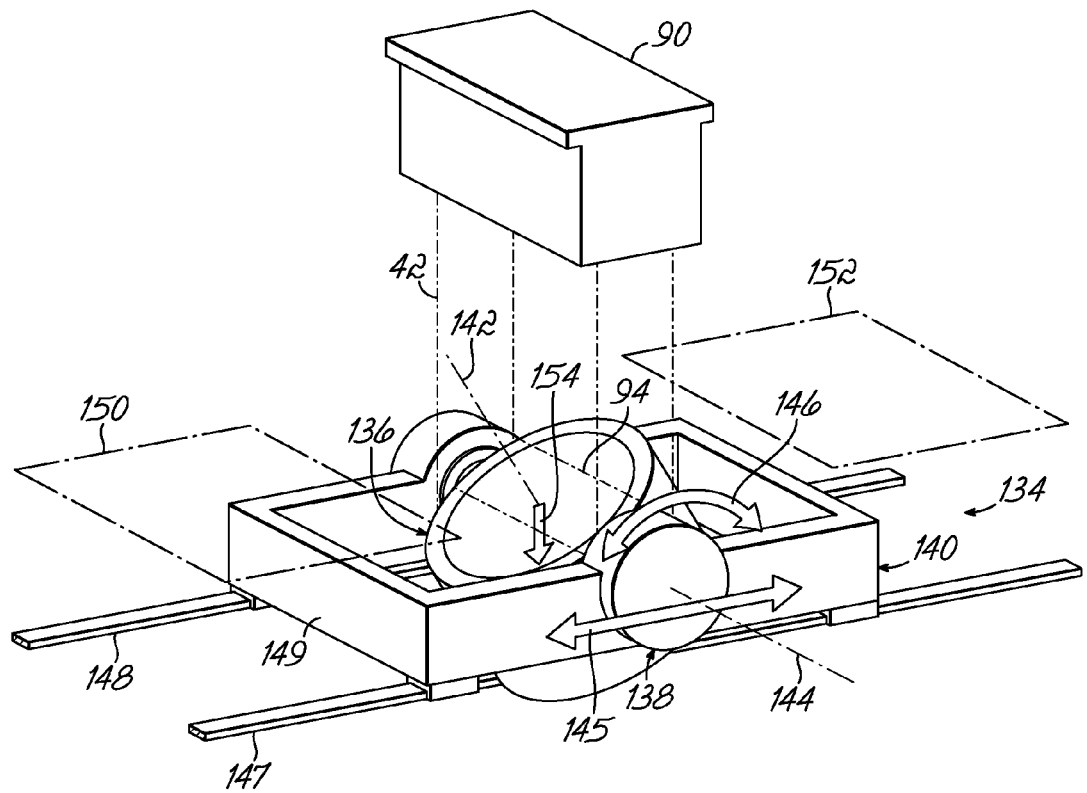

In use and with reference to FIGS. 20-22, the translation stage 140 is operated to move the substrate 44 to a position within the parking area 150 and the tilt stage 138 is operated to pivot the rotational stage 136 about the tilt axis 144 to set a tilt angle for the substrate 44 relative to the direction of the beam 42 from linear ion source 90. The tilt angle sets an angle of incidence for the beam 42. The tilt axis 144 is substantially parallel to the major dimension 89 of the energetic particle beam 42.

While within the one of the parking areas 150, 152, the initial angular orientation of the rotational stage 136 about the azimuthal axis 142 is captured and stored. The initial angular orientation of the rotational stage 136 and substrate 44 is indicated by arrow 154. The translation stage 140 is operated to move the substrate 44 into and through the beam 42 (i.e., through the treatment zone 94), which exposes the substrate 44 and features 66 to the beam 42, to parking area 152 and back to parking area 150 to execute a single scan. While the substrate 44 is sitting in the parking area 150 and as shown in FIG. 21, the rotational stage 136 is operated to index the substrate 44 about azimuthal axis 142 with a fixed, incremental angular arc relative to the initial angular orientation. The indexing of substrate 44 is reflected by the counterclockwise reorientation of arrow 154 in comparison with the angular orientation of arrow 154 in FIG. 20. The tilt angle is typically not changed, which means that the incident angle of the beam 42 is unchanged during the upcoming scan through the beam 42.

The translation stage 140 is again operated to move the substrate 44 through the beam 42 and back to the parking area 150 in another scan. Successive index and scan cycles are executed to process the substrate 44 with the beam 42. For example, another scan cycle is shown in FIG. 22 in which the substrate 44 has been rotated by another angular increment relative to the angular orientation in FIG. 22. The sequence shown in FIGS. 20-22 reflects an angular increment of 90° for indexing the substrate 44 about the azimuthal axis 142 between consecutive scans through the beam 42.

This method may be used to etch round or rectangular photoresist or hard mask features 66 on a substrate 44 to provide critical dimensions (i.e., shape) control of defined features 66 over the substrate 44. During each sliding pass, the substrate 44 is oriented in the beam 42. The resulting etch profile of the sidewalls of the features 66 can be controlled based on the orientation of the beam 42 with respect to the substrate 44—incidence angle and azimuthal angle. The substrate 44 repeatedly can be parked in parking area 150, indexed to a different angular orientation about the azimuthal axis 142, and then slid under the beam 42 for further etching at a different orientation condition. Using this method, the shape of the sidewall(s) of the features 66 and redepostion of the etched material on the features 66 can be controlled by multi-step processing.

Multiple index/scan cycles are envisioned by the various embodiments of the invention. The number of selected indexes of substrate 44 about the azimuthal axis 142 may be two different angular orientations (e.g., 0° and 180°), four different angular orientations (0°, 90°, 180°, 270°), or even more different angular orientations within a full substrate rotation of 360°. For example, a 30° to 60° angular increment may be selected for the indexing of substrate 44. The angular increment for each change in angular orientation is typically an integer fraction of 360° and, in one embodiment, is less than an integer fraction of one-half. When the substrate 44 is indexed about the azimuthal axis 142, such as from 0° to 180° as shown between pass number 1 in FIG. 21 and pass number 3 in FIG. 23, exposures of the features 66 to the beam 42 can be equalized.

For features 66 having two critical perpendicular dimensions (i.e., "square" features), four scans with orientations about the azimuthal axis 142 that differ by 90° may be sufficient for processing the features 66 on the substrate 44. For features 66 having critical dimensions in every direction (i.e., "round" features), scans may be used that include with many different angular orientations about the azimuthal axis 142.

The use of a linear ion source 90 allows for full beam exposure of relatively large substrates (i.e., 300 mm substrates) while keeping the grids of the ion source 90 in proper position for consistent beam optics and without the use of spacers. A lack of spacers in turn promotes improved spatial uniformity of the beam 42.

The multiple-stage fixture 134 and its method of use provide enhanced feature geometry control, diminished inboard/outboard effects, and are compatible with 200 mm (8 inch) and 300 mm (12 inch) wafer processing, as well as the processing of wafers or substrates with other dimensions.

The beam from ion source 90 is used to create a highly collimated, uniform beam 42 for etching of material off substrate 44. However, a person having ordinary skill in the art will understand that the ion source 90 may be used to deposit material on the substrate 22. For example, deposition can be performed in analogy to an etch process using a linear magnetron as a source of particles, or a linear ion beam source as a source of an ion beam.

Figure 23:
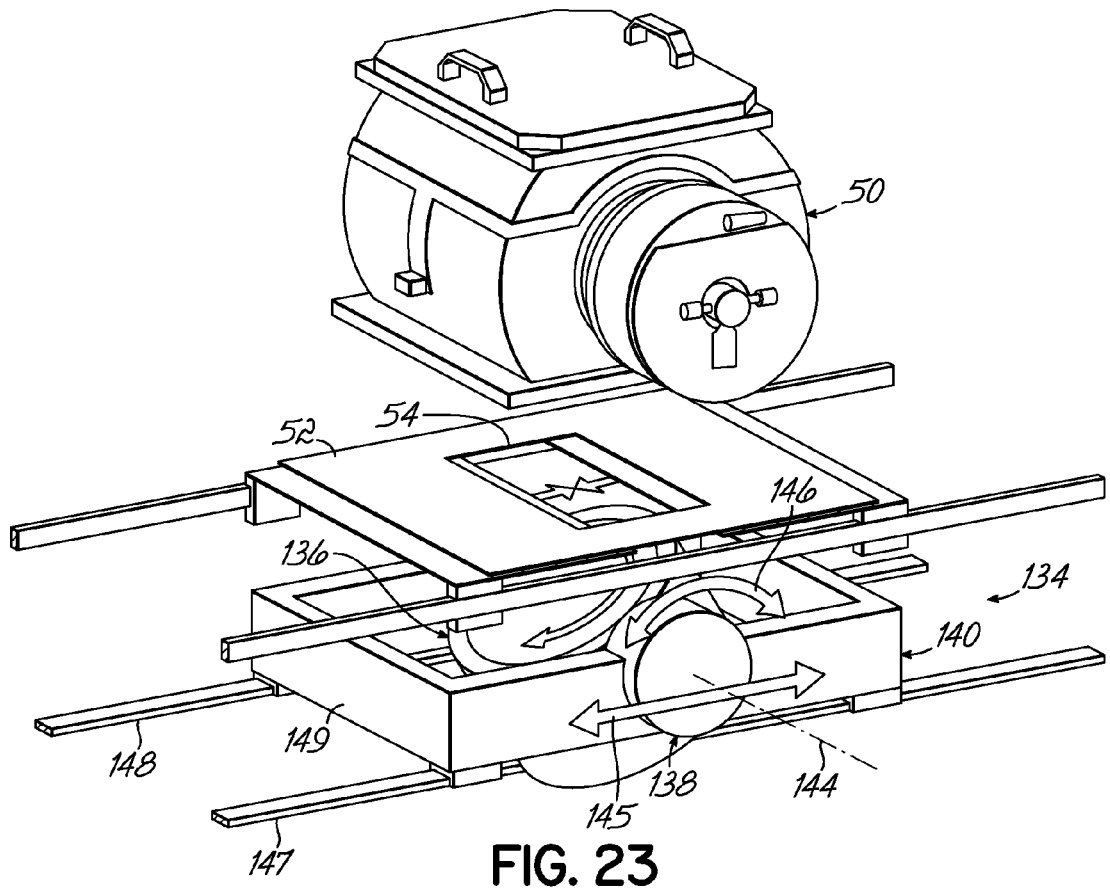
FIG. 23 is a diagrammatic perspective view of a substrate processing apparatus in accordance with an alternative embodiment of the invention.

With reference to FIG. 23 in which like reference numerals refer to like features in FIGS. 20-22 and in accordance with an alternative embodiment of the invention, ion source 90 may be replaced with the ion source 50 and the shield 52 that includes aperture 54. In this embodiment, the movement of the translation stage 140 is linear and bi-directional (i.e., reversible) relative to the aperture 54 in shield 52. In particular, the translation stage 140 translates the substrate 44 in a direction approximately orthogonal to the major dimension 65 (FIG. 4A) of aperture 54 in shield 52. The range of travel for the translation stage 140 is selected such that substrate 44 is positioned in flux-blocked positions on opposite sides of aperture 54 in which a portion of the shield 52 is interposed between the substrate 44 and source 50. A person having ordinary skill in the art will also understand that the method of exposing the substrate 44 to the beam 42 illustrated in FIGS. 20-22 may be practiced using the embodiment of the invention depicted in FIG. 23, which also presents a rectangular source of collimated particles in the beam 42 to the substrate 44.

While the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicants' general inventive concept.

We claim:

1. A method of fabricating a data storage or semiconductor device or array of devices by processing a substrate having a plurality of aligned and substantially parallel features, the plurality of features having at least one common critical dimension, the method comprising:
   (a) supplying an energetic particle beam having a major dimension and a minor dimension that is smaller than the major dimension, the energetic particle beam having a substantially uniform flux distribution over at least a portion of the major dimension and divergence of the energetic particle beam defines the minor dimension;
   (b) indexing the substrate about an azimuthal axis by an angular increment which is an integer fraction of 360 degrees, to orient the at least one critical dimension of the plurality of features on the substrate with a first fixed angular orientation relative to the major dimension of the energetic particle beam;
   (c) translating the substrate relative to the energetic particle beam substantially perpendicular to the substantially parallel features; and
   (d) exposing the substrate to the energetic particle beam in a treatment zone during at least a portion of the translation.

2. The method of claim 1 further comprising:
(e) indexing the substrate about an azimuthal axis by an angular increment to reorient the at least one critical dimension of the plurality of features with a second fixed angular orientation relative to the major dimension of the energetic particle beam; and
(f) repeating steps (c) and (d), and then repeating steps (b) through (f) for a finite number of times.

3. The method of claim 2 wherein the substrate is translated to a location outside of the treatment zone before and while the substrate is indexed about the azimuthal axis to reorient the at least one critical dimension of the plurality of features with the second fixed angular orientation.

4. The method of claim 2 wherein the angular increment is 30°, 60°, or 90°.

5. The method of claim 2 wherein the angular increment is an integer fraction of 360° less than one-half.

6. The method of claim 1 wherein translating the substrate relative to the energetic particle beam further comprises:
(e) moving the substrate linearly through the treatment zone; and
(f) reversing the linear movement of the substrate so that the substrate is exposed to the energetic particle beam in the treatment zone during the reversed movement.

7. The method of claim 6 wherein the substrate is indexed about the azimuthal axis before the linear movement is reversed.

8. The method of claim 6 wherein translating the substrate relative to the energetic particle beam further comprises:
stopping the linear movement of the substrate before the substrate is rotated.

9. The method of claim 1 wherein translating the substrate relative to the energetic particle beam further comprises:
moving the substrate in a planetary motion through the treatment zone.

10. The method of claim 1 further comprising:
indexing the substrate about an azimuthal axis by an angular increment to reorient the at least one critical dimension of the plurality of features with a plurality of angular orientations relative to the major dimension of the energetic particle beam; and
repeating the steps (c) and (d) for each of the plurality of angular orientations.

11. The method of claim 1 wherein each of the plurality of features includes first and second side walls, and further comprising:
rotating the substrate a number of times sufficient to provide a symmetrical treatment profile of the substrate proximate the first and second side walls of each of the plurality of features as steps (c) and (d) are repeated for a corresponding plurality of times.

12. The method of claim 1 wherein exposing the substrate to the energetic particle beam further comprises:
etching the substrate with the energetic particle beam.

13. The method of claim 1 wherein exposing the substrate to the energetic particle beam further comprises:
depositing a coating on the substrate with the energetic particle beam.

14. The method of claim 1 further comprising:
tilting the substrate about an axis substantially parallel to the major dimension of the energetic particle beam to set an angle of incidence between an azimuthal axis of the substrate and the energetic particle beam.

15. The method of claim 1 wherein divergence of the energetic particle beam is collimated to further define the minor dimension.

16. The method of claim 1 further comprising:
placing an aperture along the energetic particle beam, the aperture configured to collimate divergence of the energetic particle beam and further define the minor dimension.

17. The method of claim 15 wherein the aperture includes a length defining the major dimension of the energetic particle beam and a width defining the minor dimension of the energetic particle beam.

18. The method of claim 1 wherein the major dimension is greater than a diameter of the substrate and the minor dimension is less than or equal to a diameter of the substrate.

19. The method of claim 1 wherein the energetic particle beam includes a beam divergence across the minor dimension, the method further comprising:
reducing the beam divergence across the minor dimension so as to reduce variation in a treatment profile of each of the plurality of features.

20. The method of claim 6 further comprising:
repeating the sequence of steps (a) through (f) a finite number of times,
wherein on the first and subsequently every alternate repeat of the steps (a) through (f) the substrate is indexed about an azimuthal axis to orient the at least one critical dimension of the plurality of features on the substrate with a first fixed angular orientation relative to the major dimension of the energetic particle beam, and on the other repeat of steps (a) through (f) the substrate is indexed about an azimuthal axis to re-orient the at least one critical dimension of the plurality of features with a second fixed angular orientation relative to the major dimension of the energetic particle beam.

* * * * *